United States Patent [19]
Cantor

[11] Patent Number: 5,656,937
[45] Date of Patent: Aug. 12, 1997

[54] LOW-NOISE SYMMETRIC DC SQUID SYSTEM HAVING TWO PAIRS OF WASHER COILS AND A PAIR OF JOSEPHSON JUNCTIONS CONNECTED IN SERIES

[75] Inventor: Robin H. Cantor, San Jose, Calif.

[73] Assignee: Conductus, Inc., Sunnyvale, Calif.

[21] Appl. No.: 478,061

[22] Filed: Jun. 7, 1995

[51] Int. Cl.$^6$ .................. G01R 33/02; G01R 33/035; H01L 21/00; H01L 39/22
[52] U.S. Cl. .................................. 324/248; 505/846
[58] Field of Search .................. 324/248; 327/527, 327/528; 257/31; 505/845, 846, 874

[56] References Cited

U.S. PATENT DOCUMENTS 5,053,834  10/1991  Simmonds ........................... 357/5
5,157,466  10/1992  Char et al. .......................... 357/5
5,219,826  6/1993  Kapitulnik ........................... 505/1

OTHER PUBLICATIONS

Clarke, J. "SQUIDS: Theory & Practice" (1993) *New Superconductivity Electronics*, Kluwer Academic Publishers.

Knuutila, J., et al., "Design, Optimization, and Construction of a DC SQUID with Complete Flux Transformer Circuits," (1988) *J. Low Temp. Phys.* 71:(5/6)369–391.

Yamasaki, et al., "Design and Fabrication of Multichannel DC SQUIDS for Biomagnetic Applications" (1993) *IEEE Transactions on Applied Superconductivity* 3:(1) 1887–1889.

Foglietti, et al., "A Double dc-SQUID Device for Flux Locked Loop Operation" (1991) *IEEE Transactions on Magnetics* 27:(2)2989–2992.

Cantor, et al., "Design and Optimization of DC SQUIDS Fabricated Using a Simplified Four-Level Process" (1991) *IEEE Transactions on Magnetics* 27:(2)2927–2931.

Ryhanen, T. and Seppa, H., "Effect of Parasitic Capacitance and Inductance on the Dynamics and Noise of dc Superconducting Quantum Interference Devices" (1992) *J. Appl. Phys.* 71:(12)6150–6166.

*Primary Examiner*—Walter E. Snow
*Attorney, Agent, or Firm*—Merchant, Gould, Smith, Edell, Welter & Schmidt

[57] ABSTRACT

A multiple loop dc SQUID configuration with input and modulation circuitry configured for high-symmetry and low-noise operation is disclosed. The configuration is adaptable to implementation using standard thin film circuit fabrication technology. The SQUID inductance is defined by a plurality of washer-shaped thin superconducting films symmetrically oriented on a substrate and connected in series through a pair of Josephson junctions to form a multiple-washer gradiometric structure. The series connection arrangement also minimizes the number of required input and output terminal pads. Bias and modulation conductors are configured so as to prevent magnetic fields produced by currents flowing therethrough from coupling to the SQUID, and the modulation and input coil portions of the SQUID circuit are symmetrically configured to minimize signal coupling therebetween. A method of parameter selection for the input and modulation circuit portions of the SQUID configuration is disclosed which establishes a well-defined resonance point for the SQUID, within which low-noise operation is possible.

24 Claims, 11 Drawing Sheets

LOW-NOISE SYMMETRIC DC SQUID SYSTEM HAVING TWO PAIRS OF WASHER COILS AND A PAIR OF JOSEPHSON JUNCTIONS CONNECTED IN SERIES

STATEMENT OF GOVERNMENT INTEREST

The U.S. Government has a paid-up license on this invention and the right in limited circumstances to require the patent owner to license others on reasonable terms as provided for by the terms of contract No. NAS5-38014 awarded by the National Aeronautics and Space Administration.

FIELD OF THE INVENTION

This invention relates generally to superconducting quantum interference devices (SQUIDs), and more particularly to a highly symmetrical, ultralow-noise DC SQUID configuration.

CROSS-REFERENCE TO RELATED PATENTS

U.S. Pat. No. 5,053,834 to Simmonds is hereby incorporated by reference to the extent that the disclosures and teachings thereof are required for an understanding of or support for this invention.

BACKGROUND OF THE INVENTION

Superconducting quantum interference devices (SQUIDs) are the most sensitive magnetic flux detectors currently available. They have extensive versatility in being able to measure any physical quantity that can be converted to a magnetic flux, as for example a magnetic field, a magnetic field gradient, current, voltage, displacement and magnetic susceptibility. The applications for SQUIDs are quite extensive. The SQUID susceptometer has been widely used by scientists in laboratory applications for many years, but more recent advances in SQUID technology have greatly expanded its use beyond the laboratory. In the medical arena, SQUIDs are more commonly being used in magnetoencephalography and magnetocardiology, wherein SQUID magnetometers are used to measure the tiny magnetic signals generated in the brain and heart respectively. SQUIDs have also been used with superconducting magnets to create magneto-ferritometers for monitoring iron levels in the liver. In the commercial marketplace, the military has expended considerable development effort on a variety of SQUID applications. SQUIDs have also found many applications, in geophysics, from prospecting for oil and minerals to earthquake prediction through the use of active and passive SQUID systems. SQUID technology is also useful for non-destructive evaluation, including both the integrity evaluation of structures and the location of submerged or buried structures or members.

SQUIDs combine the physical phenomena of flux quantization and the Josephson effect. Flux quantization means that the flux ($\Phi$) through a closed superconducting loop is quantized in units of the flux quantum ($\Phi_o \cong h/2e \cong 2.07 \times 10^{-5}$ Wb)). The Josephson effect occurs at "boundaries" between superconducting regions of superconductor structures. Such boundaries may be achieved in a number of known ways. "Grain boundary" junctions occur at crystalline grain boundaries and are further discussed in Char et al., U.S. Pat. No. 5,157,466. Boundaries of the "tunneling type" occur where a very thin insulator is interposed between two superconductors. SNS junctions use a very thin normal conductor or weakly superconducting material as the boundary. Nano-bridge junctions use a severely restricted area of superconductor to form a weak link, and are further discussed in Kapitulnik, U.S. Pat. No. 5,219,826.

In general, a SQUID comprises a superconducting loop that is broken in at least one place by a Josephson junction. There are two kinds of SQUIDs. The first, the rf SQUID, uses a single Josephson junction to interrupt the current flow around a superconducting loop, and is operated with a radiofrequency flux bias. The second, is the dc SQUID, which has two or more Josephson junctions interrupting a superconducting loop and is biased with a steady or "DC" current bias. Recently, thin film technology has been applied to SQUID construction, making the design of dc SQUIDs more commercially practical. Both the rf and dc SQUID concepts are readily understood by those skilled in the art, and will not be detailed herein. Those not as knowledgeable with SQUID technology and theory of operation are referred to "SQUIDs: Theory & Practice," John Clarke, *New Superconductivity Electronics*, Kluwer Academic Publishers, 1993, incorporated herein by reference.

In simple terms, a dc SQUID is a magnetic flux-to-voltage convertor, since it provides an output voltage across the Josephson junctions which varies as a function of the total magnetic flux applied to its superconducting loop. The output voltage is periodic in the applied flux, with a period of one flux quantum. By applying a dc bias current and dc flux to the SQUID, to set a quiescent voltage output level, magnetic fields producing a flux in the SQUID of much less than a single flux quantum ($\Phi_o$) can be detected by measuring the deviation of the SQUID output voltage from the quiescent value. The dc SQUID is the most sensitive detector of magnetic flux available, and displays an enormous frequency response extending from dc to several GHz. The design of a SQUID determines the intrinsic performance of the device. It has been shown that the energy resolution of a low-inductance SQUID operating at 4.2K can approach the quantum limit. Besides the "rf" and "DC" SQUID distinctions, the physical nature and the resultant performance characteristics of a SQUID are related to the type of superconductor material(s) used in its fabrication. Historically, the early superconductors and resultant SQUIDs made therewith exclusively used "low-temperature" superconductor materials that display superconductivity near absolute zero. The use of low-temperature superconductor materials requires them to be placed in liquid helium at 4.2K (−269° C.). SQUIDs and magnetometers and other devices made therefrom are now commonly fabricated using single or multiple-layer thin film depositions and photolithographic and etching techniques well-known in the semiconductor industry. Low-temperature SQUID devices typically use Josephson junctions formed from stacked horizontal superconductor films such as niobium, which are aligned parallel to the substrate.

More recent discovery of higher temperature superconductive materials which display superconductive properties at temperatures over 77K, have increased the accessibility of SQUID technology. The higher temperature superconductors allow for operation in liquid nitrogen (at 77K), rather than in the much more expensive liquid helium. The higher temperature materials are generally referred to as high transition temperature "high-$T_c$" superconductors or simply "HTS" materials. Ceramics are the most common HTS superconductor materials used in SQUID technology, with the most popular being $YBa_2Cu_3O_{7-x}$ (most commonly called YBCO), which has a transition temperature of approximately 90K. HTS SQUID devices typically use a vertical Josephson junction technology, where the plane of the junction is perpendicular to the substrate, as for example junctions produced by grain-boundaries between two contiguous regions of a superconductor material having different grain or crystal orientations on either side of their juncture. While the present invention will be described with respect to its implementation in a low-temperature superconductor dc SQUID configuration, the principles of this invention apply equally well to SQUIDs employing HTS materials. In order to simplify explanation of the invention, the following discussions and descriptions will be made with reference only to low-temperature superconductors and dc SQUID configurations made therefrom. It will be understood, however, that the invention is not to be limited thereby.

To ensure low-noise operation, a "bare" dc SQUID typically is a low inductance device. A bare SQUID has a low effective flux capture area, resulting in a magnetic field resolution that is insufficient for many applications. Therefore, in practical SQUID magnetometer applications, the SQUID is often coupled to an input circuit generally having one or more pick-up loops or coils of superconductive material capable of capturing much more flux than the relatively small SQUID loop, therefore significantly increasing the magnetic field resolution of the device. Signals from the pick-up loop(s) can be either "directly" or "inductively" coupled to the SQUID loop. In low-temperature SQUID configurations excellent inductive coupling can be implemented by means of a multi-layer transformer configuration using thin film lithographic techniques. In such devices, the thin film superconductor SQUID inductance material is typically formed in the shape of a washer and is covered by an insulating layer on top of which is grown a thin film spiral superconductor coil with as many as several tens of turns, which acts as an input or transformer coil to inductively couple or transfer signals from the input coil to the underlying SQUID inductance loop. The input coil in turn is physically connected to an appropriate external magnetic flux pick-up loop.

The thin film "washer" design implementation achieves low inductance in the SQUID loop and tight coupling to multi-turn input coils by making the loop into a slotted groundplane. A second, thin film modulation coil is usually integrated on top of the SQUID washer as well, in order to couple a flux modulation signal to the SQUID. This is essential for operation of the device using conventional flux-locked loop readout electronics.

This approach has significantly advanced SQUID technology for numerous applications. However, unless the SQUID is heavily damped, the parasitic elements (i.e., capacitance and inductance) that are invariably introduced can lead to numerous resonances in the SQUID dynamics. These resonances manifest themselves as strong irregularities in the current-voltage (I-V) and in the voltage-flux (V-$\Phi$) characteristics, leading to excess noise and making operation using conventional flux modulation techniques extremely difficult. Overdamping the SQUID may reduce the excess noise, but it also diminishes the amplitude of the SQUID output signal, placing more stringent demands on the readout electronics. To be useful for a wide variety of applications, a dc SQUID with transformer coupling of the input and modulation coils must meet several general requirements including: inductance matching of the input inductance to the load inductance, insensitivity to ambient fields, negligible coupling of the modulation signal to the input circuit, negligible coupling of the bias and modulation signals to the SQUID, and low-noise performance. To date, there have been few dc SQUID devices that adequately address all of these requirements.

Considerable effort has been devoted to the design of dc SQUIDs having low noise. Most approaches use a multi-layer design consisting of an input coil integrated on top of the SQUID inductance. In double washer designs wherein the washers are configured to form a gradiometer which rejects the effects of uniform fields, the bias current which must pass through the Josephson junctions may magnetically couple into the SQUID loop. This can result in an undesirable interaction that can introduce noise and drift into the SQUID sensor from the drive electronics. Further, introducing the bias current into the junctions in a non-symmetrical manner can also make the SQUID unduly sensitive to common mode noise which may be picked upon the bias leads that run from the electronics drive package at room temperature, down to the SQUID sensor in the cryogenic environment. Such common mode noise becomes an undesirable influence on the output signal.

In addressing these issues, U.S. Pat. No. 5,053,834 to Simmonds used a symmetrical dc SQUID system having two input coils and two modulation coils symmetrically arranged on a monolithic substrate such that the system nominally has no mutual inductance between groups of signal coils and modulation coils when the SQUID is biased for normal operation. The Simmonds SQUID response is gradiometric, and the Josephson junctions are in parallel with the input and modulation secondaries in order to keep the total SQUID inductance and flux noise low. The Simmonds configuration is designed to prevent bias current flowing into the junctions from coupling to the SQUID loop, to make the device more insensitive to fluctuations or noise in the bias current circuitry, and to prevent common mode noise on the bias leads, modulation coils or signal coils from coupling into the SQUID, but does not optimize device performance for applications which require detection of extremely weak currents. For such applications the equivalent rms current noise at the SQUID input is a much more relevant figure of merit than the rms flux noise, which is addressed by the Simmonds design. The present invention provides an improved dc SQUID design which incorporates the advantages provided by a symmetrical SQUID configuration while providing improved performance over prior art designs.

SUMMARY OF THE INVENTION

The present invention provides an improved multiple loop dc SQUID configuration with input and modulation circuitry configured for high symmetry and low-noise operation. The configuration is adaptable to simplified implementation using readily available standard thin film fabrication techniques, to provide a highly reliable device. In a preferred implementation of the invention, the SQUID inductance is defined by a plurality of washer-shaped, thin superconducting films symmetrically oriented on a substrate and connected in series to form a multiple-washer gradiometric structure. The series configuration offers significant rejection of uniform background magnetic fields without the risk of setting up possibly large circulating screening currents. Each washer has a hole at its center, with a slit running from the hole to the outer edge of the washer where the washers are joined. The slit in each washer is covered by a superconducting groundplane. Each washer, together with its hole and slit, forms a single turn secondary for an input or modulation coil. In a preferred configuration, there are four such washers connected in series in a symmetrical "cloverleaf" pattern; however, it will be understood that the invention is not limited to any particular number of washers, and that the preferred embodiment illustrated herein is for illustration purposes only. In the preferred structure, two oppositely situated washers are joined together at the center of the structure, and the other two oppositely situated washers are connected together through two Josephson junctions located one per washer, at diagonally opposite sides of the washer slits. Electrical leads for current bias and voltage measurements are arranged symmetrically with respect to the washers, which prevents interaction of the bias circuit with the input and modulation circuits.

According to one embodiment of the invention, there is provided a symmetrical SQUID apparatus comprising: (a) a substrate; (b) a first pair of identical superconductor washers symmetrically formed on the substrate to address each other in mirror-like configuration, each of the first pair of washers having a central opening and a slit extending therefrom to a washer edge at a central region of the apparatus; wherein said slits of the first pair of washers are commonly aligned; (c) a second pair of identical superconductor washers symmetrically formed on the substrate to address each other in mirror-like manner, each of the second pair of washers having a central opening and a slit extending therefrom to a washer edge at the central region; wherein the slits of the second pair of washers are commonly aligned and generally at right angles to the slits of the first pair of washers; (d) a pair of Josephson junctions symmetrically disposed in the central region on the substrate relative to the first and second pairs of washers; (e) superconductor connecting means on the substrate operatively connecting the first and second pairs of washers in series through the Josephson junctions, forming a series-connected SQUID loop; (f) bias lead means operatively connected with the Josephson junctions for biasing the junctions; (g) first input lead means operatively connected with the first pair of washers for providing input signals thereto; and (h) second input lead means operatively connected with the second pair of washers for providing modulation input signals thereto.

According to another aspect of the invention, a superconductor groundplane substantially operatively overlying the slits of the first and second pairs of washers is provided. Another aspect of the invention also provides for series-connected pairs of input coils configured to overlie and inductively couple with the first pair of washers for providing input signals thereto, and a second pair of series-connected coils configured to overlie and inductively couple with the second pair of washers for providing modulation or feedback signals thereto.

According to yet another aspect of the invention, the SQUID configuration is constructed using thin film technologies, wherein the superconductor materials are preferably Niobium. The components constructed by means of the film technology are symmetrically configured and electrically balanced so as to minimize coupling from modulation and bias signals to the SQUID loop and so as to minimize or cancel interference and coupling between components of the assembly. The film technology also provides for the formation of film shunt resistors across the Josephson junctions and for the formation of series resistor/capacitor shunt components for connection in parallel with the signal input coil portions of the system.

According to yet a further aspect of the invention, there is provided a symmetrical SQUID system, comprising: (a) first and second connected superconductor washers, forming a first SQUID washer pair; (b) third and fourth connected superconductor washers, forming a second SQUID washer pair; said second SQUID washer pair being identically shaped and being symmetrically and oppositely oriented relative to said first SQUID washer pair about a central region; (c) a pair of series-connected Josephson junctions in said central region, operatively symmetrically aligned relative to said first and said second SQUID washer pairs; (d) superconductor connecting means for operatively connecting said first and second SQUID washer pairs in series through said pair of Josephson junctions to form a series-connected SQUID loop; (e) first input circuit lead means symmetrically positioned relative to said first and second SQUID washer pairs for providing input signals thereto; and (f) output bias lead means operatively connected to said pair of Josephson junctions for biasing said junctions and for providing output signals from the SQUID system.

According to yet a further aspect of the invention, there is provided a method of configuring a SQUID circuit of the type having a pair of Josephson junctions, and input and modulation circuitry, for low-noise operation, comprising the steps of: (a) providing input circuit portions of the SQUID circuit with high inductance for matching arbitrary external circuits; (b) providing the SQUID circuit with a gradiometric configuration for desensitizing the SQUID circuit to uniform external ambient fields; (c) symmetrically configuring modulation and input coil portions of the SQUID circuit to minimize signal coupling therebetween; (d) routing signal flow paths for current bias and modulation signals of the SQUID circuit to prevent magnetic fields produced by signals flowing therethrough from coupling to the SQUID; and (e) electrically connecting the input and modulation secondary circuits of the SQUID in series with the Josephson junctions to minimize the rms current noise of the SQUID. The invention further includes the above method wherein parameters for the input and modulation circuit portions of the SQUID circuit are selected to define a well-defined resonance point for the SQUID within which low-noise operation is possible.

According to yet a further aspect of the invention, there is provided a method of configuring a method of configuring a SQUID circuit of the type having a pair of Josephson junctions, and input and modulation circuitry, for low-noise operation, comprising the steps of: (a) providing input circuit portions of the SQUID circuit with high inductance for matching arbitrary external circuits; (b) providing the SQUID circuit with a gradiometric configuration for desensitizing the SQUID circuit to uniform external ambient fields; (c) symmetrically configuring modulation and input coil portions of the SQUID circuit to minimize signal coupling therebetween; (d) routing signal flow paths for current bias and modulation signals of the SQUID circuit to prevent magnetic fields produced by signals flowing therethrough from coupling to the SQUID; and (e) selecting parameters for the input and modulation circuit portions of the SQUID circuit to define a well- defined resonance point for the SQUID within which low-noise operation is possible. The invention further contemplates the above method, wherein said resonance point is determined by the equation $(½π) [L_m(C/2)]$ $L_m$ is the sum of the inductances defined by the openings in the modulation washer portions and C is the Josephson junction capacitance.

While the preferred embodiment of the invention is described with reference to a thin film implementation using low-temperature superconductor materials, it will be appreciated by those skilled in the art that the invention is not limited to the low-temperature superconductor materials described, or even to low-temperature superconductors in general. Further, while the preferred embodiment of the invention is developed with respect to a particular film layout and its intended use in SQUID applications requiring low input current noise, it will be appreciated that as the end use applications for the invention vary, so will the specified design criteria for the symmetrical dc series-connected SQUID parameters. These and other aspects of the invention are only exemplary of embodiments of configurations, materials and/or design considerations used to implement structures that practice the broad principles of the invention. It will be understood that those skilled in the art may readily perceive yet other variations of the invention not specifically described above or in the following specification, but clearly included within the scope of the appended claims.

BRIEF DESCRIPTION OF THE DRAWING

Referring to the Drawing, wherein like numerals represent like parts throughout the several views:

FIG. 8 illustrates a number of graphical comparisons between the series-connected dc SQUID configuration of this invention versus a parallel-connected dc SQUID configuration;

DETAILED DESCRIPTION OF THE INVENTION

Figure 1:
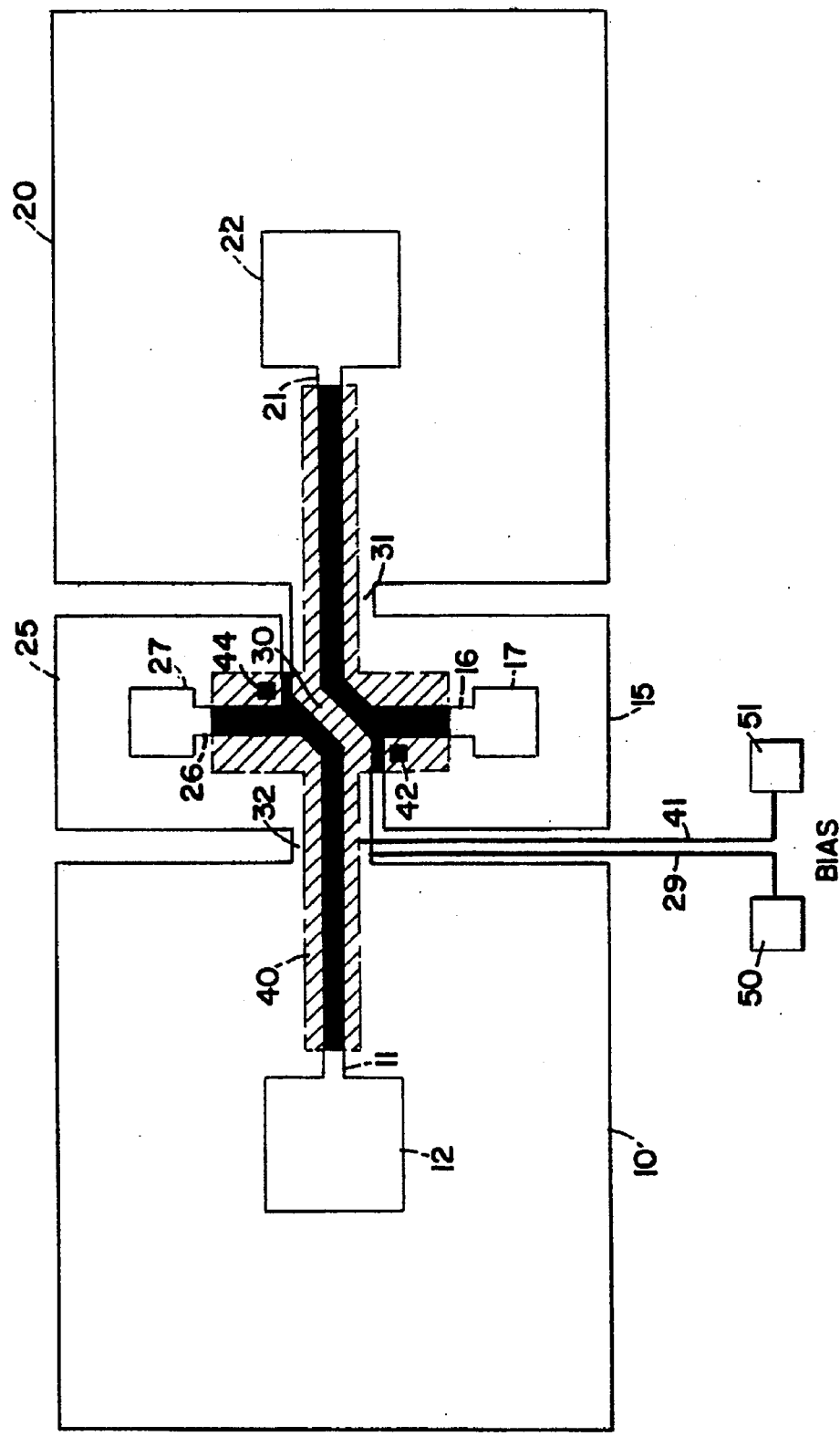
FIG. 1 is a diagrammatic functional layout diagram in plan view of a thin film symmetric SQUID design configured according to the principles of this invention, illustrating those layers containing the SQUID loop inductance groundplane, and the series-connected washers and Josephson junctions of the device.

This invention provides a dc SQUID device with input and modulation circuitry configured for high symmetry and low-noise operation, which provides an ideal building block for amplifiers, particularly those requiring high effective input inductance and very low equivalent current noise. The invention represents an improvement over the symmetrical dc SQUID apparatus disclosed in U.S. Pat. No. 5,053,834, the disclosures of which are herein incorporated by reference. As stated in the Background description, in order to be useful for a wide variety of applications, a dc SQUID with transformer coupling of the input and modulation signals must meet several general requirements, briefly summarized below.

(1) Inductance Matching. The SQUID input circuit should have a high inductance in order to satisfy inductance matching to arbitrary external circuits. A value of the order of 1 $\mu$H is typical.

(2) Insensitivity to Ambient Fields. The SQUID itself should be insensitive to ambient fields which may be present in the measurement environment. This is generally accomplished by surrounding the SQUID as much as possible by a superconducting shield, and by designing the SQUID with a gradiometric configuration. This is typically accomplished using two washers which may be connected in parallel (as in the Simmonds configuration) or in series (as in this invention) with the two Josephson junctions. In either case, such SQUID will have zero response to a uniform external field. The response to external field gradients will also be negligible if the separation between the holes in the two washers is small, as is typical.

(3) Negligible Coupling of the Modulation Signal to the Input Circuit. If the modulation and input coils are not sufficiently isolated, the modulation signal necessary for flux-locked loop operation may couple to the input circuit and interact with the load connected to the SQUID. This may distort the measured data. For this reason, the SQUID must be designed with negligible coupling of the modulation signal to the input circuit.

(4) Negligible Coupling of the Bias and Modulation Signals to the SQUID. The electrical connections to the SQUID for the current bias and modulation signals should be routed to prevent the magnetic fields arising from these signal currents from coupling to the SQUID. Substantial self-coupling may adversely affect proper operation of the SQUID.

(5) Low-Noise Performance. In order to successfully realize the extreme sensitivity of the dc SQUID, the SQUID design must take into account the adverse effects of the parasitic capacitance and the microwave resonances invariably present in integrated thin film transformer circuits. A commonly used figure of merit for dc SQUID performance is the rms magnetic flux noise. To achieve low flux noise, the SQUID inductance is usually made as small as possible, subject to the constraint that the SQUID input circuit be inductively matched to the anticipated load. For this reason, gradiometric SQUID designs have usually been configured with the SQUID washers in parallel with the Josephson junctions. The total inductance is then one-half the single washer inductance.

While the Simmonds configuration generally meets the five above requirements, it does not provide the desired performance for applications which require the detection of extremely weak currents. In particular, for such applications, the rms flux noise may not be the best figure of merit. A more relevant figure of merit is the equivalent rms current noise at the SQUID input. The rms current noise is given by $S_I^{1/2}(f) = S_\Phi^{1/2}(f)/M_i$, where $S_\Phi^{1/2}(f)$ is the rms flux noise of the SQUID and $M_i$ is the mutual inductance of the input coil and the SQUID inductance. To be useful for the widest possible range of applications, it is desirable not only to achieve the lowest possible flux noise, but also to design the SQUID input circuit to obtain the highest possible mutual inductance with respect to the SQUID.

The following analysis illustrates the desirability of the present invention's series configuration over a parallel configuration. A simple model wherein $L_x$ and $n_x$ (where x=s or p) denote the inductance per washer and the number of turns in the input coil coupled to each washer for the series and parallel configurations respectively can be used. Assuming that the coupling constant which describes the coupling of each input coil to its respective washer is unity, and that the slit inductances of each washer are negligible, the total inductances for the two configurations may be approximated as in Table 1 below.

TABLE 1

Inductance Comparisons for
Series and Parallel Washer Configurations

| Inductance | Series | Parallel |
|---|---|---|
| Total SQUID inductance | $2L_s$ | $L_p/2$ |
| Total input inductance | $2n_s^2 L_s$ | $2n_p^2 L P$ |
| Total mutual inductance | $2n_s L_s$ | $n_p L_p$ |

Assuming that it is desirable to match to the same load inductance and to have the same mutual inductance for both configurations, then $$2n_s^2 L_s = 2n_p^2 L_p$$

$$2n_s L_s = n_p L_p$$

and it follows that $n_p = n_s/2$ and $L_p = 4L_s$. The total SQUID inductance turns out to be the same for both configurations. Therefore, if one ignores possible excess noise due to parasitic effects and microwave resonances, one would expect the flux noise of both configurations to be compatible. The parasitic capacitance in the parallel configuration, however, is likely to be as much as four times higher than in the series configuration. Excessive parasitic capacitance can degrade the performance of the SQUID. Also, the resonant frequency of the washers in the parallel configuration occurs at a much lower frequency because of the large size of the washers in that case. For a square washer with a square hole in the center, the inductance is given by $1.25 \mu_o d$, where d is the side length of the hole. This means that the opening in each of the washers in the parallel configuration is four times larger than in the series configuration. Even though twice as many input coil turns are required in the series configuration, the much larger hole size required in the parallel configuration causes each washer to have a larger overall dimension. This can push the washer resonance dangerously close to the intended SQUID operating frequency. Furthermore, the large washer openings in the parallel configuration significantly increase the flux capture area of the SQUID. This means that large screening currents may be generated in response to uniform ambient fields. Such screening currents may lead to flux trapping in the Josephson junctions or otherwise compromise the operation of the SQUID. The flux capture area of the series configuration is much smaller, but more importantly, the screening currents completely cancel. Therefore, the series configuration may be less susceptible to flux trapping. Accordingly, the series configuration appears to have significant advantages over the parallel configuration.

Besides the series configuration distinction, the present invention utilizes a layout for the electrical connections made to the SQUID which reduces the number of contact pads required over prior art devices. The electrical leads to the modulation circuit and the SQUID body are arranged as two pairs of coplanar lines with the two "free" ends of each pair being connected to wire bond pads. Therefore, only four pads are required rather than the eight pads required by prior art parallel configurations. This feature not only simplifies assembly but improves reliability. As long as the separation between the two lines of each coplanar pair is small, the stray fields should be minimal, and self-coupling effects should be negligible.

Figure 2:
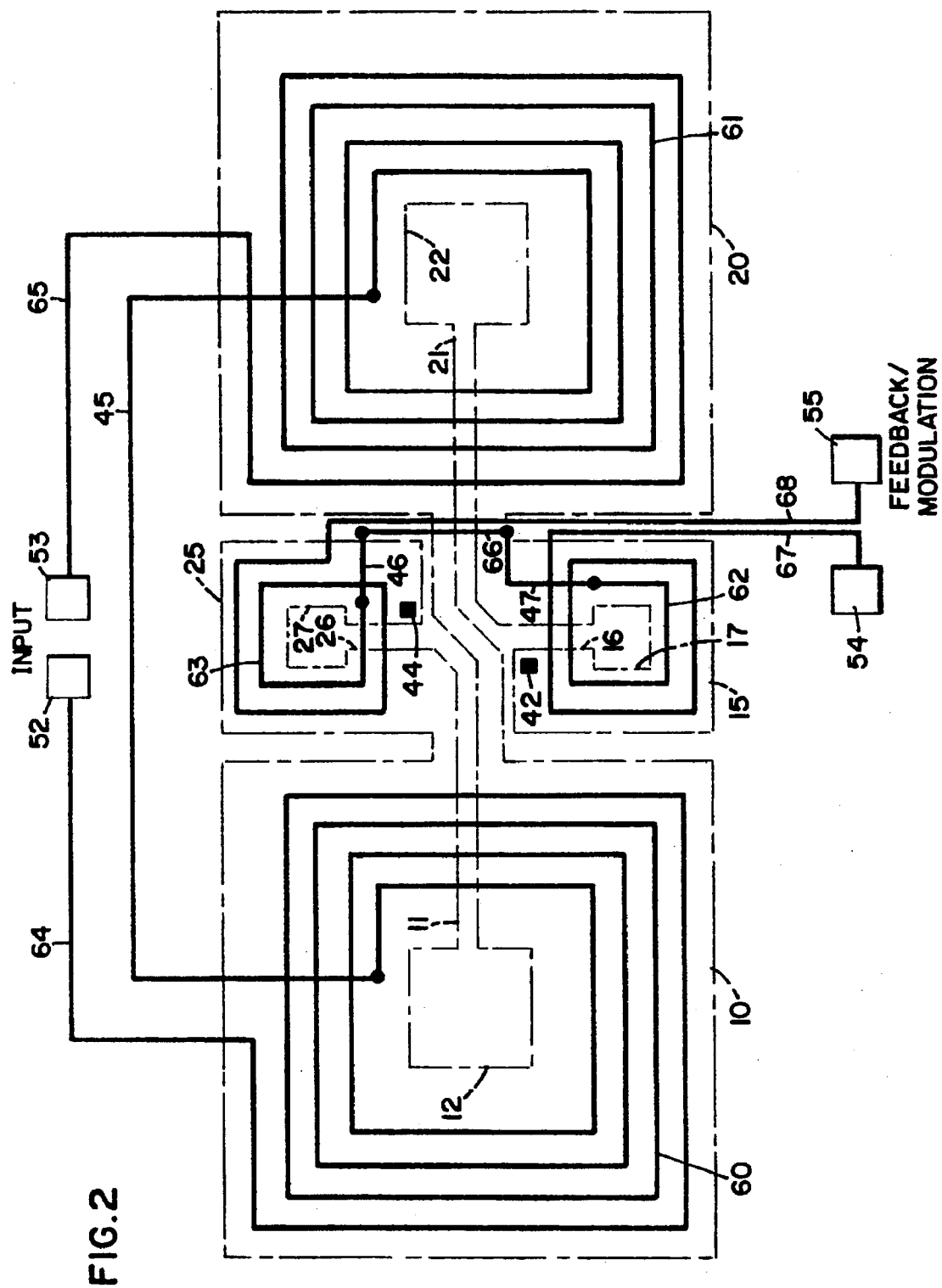
FIG. 2 is a diagrammatic functional layout diagram in plan view similar to that of FIG. 1, illustrating those layers containing the modulation and input coil portions of the device as they appear superimposed with the SQUID loop inductance portions of FIG. 1.

With the above general design requirements and distinctions of the series configuration design over that of prior parallel configurations in mind, a better understanding of the present invention can be had with reference to FIGS. 1 and 2. Referring thereto, a preferred embodiment of the invention is "diagrammatically" illustrated. The diagrams of FIGS. 1 and 2 are not drawn to scale, and are not proportionately configured as they would be in an actual device, but are merely intended to facilitate an understanding of the relative orientations and interconnections between various physical and electrical portions of the inventive SQUID assembly. A diagrammatic plan view of the SQUID loop inductance "washer" layer and the series-connection Josephson junctions of the device and their respective interconnections, is generally illustrated in FIG. 1. Referring thereto, the material defining the four interconnected washer loops comprises a thin film layer of superconductor material. In the preferred embodiment hereinafter described in more detail, such layer comprises niobium. The layout configuration of the washer design is symmetrical or balanced, and includes first and second signal input washers 10 and 20 respectively of generally identical size and configuration. The input washers 10 and 20 respectively define aligned slots 11 and 21 respectively extending from cooperatively facing edges of the washers 10 and 20 and inwardly to central openings or holes 12 and 22 respectively of the washers 10 and 20. The washers 10 and 20 with their slots and central openings respectively form single turn secondaries for the two signal input transformers of the SQUID, as hereinafter described in more detail. The first and second input washers 10 and 20 are interconnected in part by means of a coplanar strip of superconductor material 30 patterned from the same film used to define the input washers.

Third and fourth washer members 15 and 25 respectively lying coplanar with and configured from the same superconducting material as the signal input washers 10 and 20, define the single turn secondaries for the modulation or feedback transformer coils of the system. The modulation washers 15 and 25 are symmetrically disposed between the first and second washers 10 and 20 and respectively define aligned slots 16 and 26 respectively originating from outer facing edges of the washers 15 and 25 and extending inwardly to central openings 17 and 27 respectively of the third and fourth washers 15 and 25. As was the case for washers 10 and 20, washers 15 and 25 are identical mirror images of one another and are symmetrically configured with respect to one another and with respect to washers 10 and 20. The aligned slots 16 and 26 of the third and fourth washers 15 and 25 respectively are oriented generally at right angles to the aligned slots 11 and 21 of the signal input washers 10 and 20 respectively. The washers 20 and 15 are electrically connected by means of a superconductor strip of material 31, and the washers 25 and 10 are electrically connected by means of a superconductor strip of material 32. The four washers 10, 15, 20 and 25 and their interconnecting strips 30, 31 and 32 are commonly formed by a niobium superconductor film deposited over other thin film layers on a common substrate in a manner well-known in the art and described below with respect to a preferred embodiment of this invention.

A groundplane of superconductor material, generally indicated at 40 is configured to underlie the four washer slots 11, 16, 21 and 26 and is electrically insulated from the superconductor material forming the washers by an insulative layer (not illustrated), except for those areas designated at 42 and 44 which define first and second Josephson junctions of the SQUID assembly. The Josephson junctions extend from the groundplane superconductor and through the insulative layer and make electrical contact with the superconductor material of the third and fourth washers 15 and 25 respectively. Other thin film patterns of the superconductor material used to define the groundplane form interconnecting conductive links and conductive lead paths (to be hereinafter described in more detail) for the input and modulation coil portions of the SQUID assembly.

A pair of bias conductors 29 and 41 provide electrical signal bias connections to the washer and Josephson junction assembly. The bias leads 29 and 41 extend closely adjacent to one another from bonding pads 50 and 51 respectively and to the SQUID assembly. The bias lead 29 is commonly formed from the thin film material comprising the washers and is electrically connected to the interconnecting strip 30. The second bias conductor 41 is formed from the superconductor material of the groundplane, and is electrically connected with the groundplane 40. Additional layers of deposited insulator and resistive materials form part of an actual thin film device, as will be hereinafter described in more detail, but for simplicity, are not illustrated in FIGS. 1 and 2.

The "coil" layer is diagrammatically illustrated in FIG. 2, showing the coils as they conceptually align with the washer and interconnect portions of the SQUID configuration previously described in FIG. 1. The washer outlines are illustrated in phantom in FIG. 2. In the preferred embodiment, as hereinafter described, the coil layer is actually deposited first on the substrate and underlies the later deposited washer material. Referring to FIG. 2, first and second primary signal input coils 60 and 61 are spirally wound to cooperatively underlie and align with the first and second washers 10 and 20 respectively. Third and fourth coils 62 and 63, defining the primary modulation or feedback coil windings are cooperatively spirally wound in relation to the third and fourth washers 15 and 25 respectively. The coils 60, 61, 62 and 63 are commonly formed from a thin film superconductor material, as hereinafter described. The inwardly wound ends respectively of the first and second signal input coils 60 and 61 are physically and electrically interconnected by means of a superconductor link 45. The outer ends of the first and second primary signal coils 60 and 61 are extended to form lead lines 64 and 65 respectively extending to a pair of signal input pads 52 and 53. The inwardly wound ends of the primary modulation coils 62 and 63 are electrically connected by means of a superconductor link formed of segments 46, 47 and 66. The outer ends of the modulation coil windings 62 and 63 extend to form lead lines 67 and 68 which extend to feedback or modulation bonding pads 54 and 55 respectively. In the preferred embodiment, the interconnecting links 45, 46 and 47 are formed from the same superconductor material used to define the groundplane 40. The interconnecting link 66 as well as the lead lines 64–68 are deposited at the same time and are formed from the same material as the coils 60–63. In the preferred embodiment, the separation between any two lead lines of a coplanar pair (such as leads 29, 41 and leads 67, 68) is small, such that stray fields are minimal and self-coupling effects are negligible. In FIGS. 1 and 2, the solid circular areas denote vias or interconnecting links between physical layers of the structure.

Figure 3:
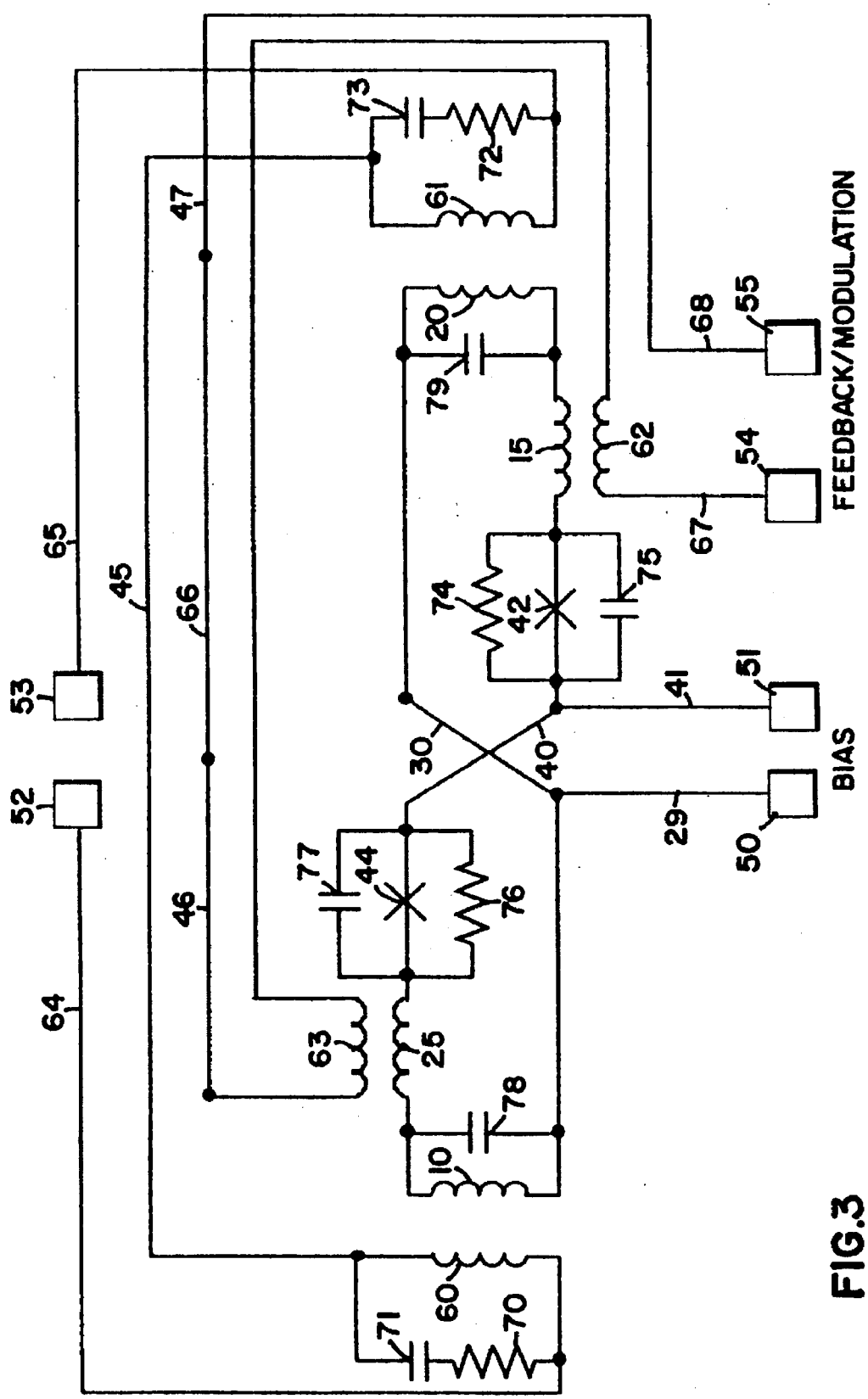
FIG. 3 is an electrical schematic diagram of the symmetrical SQUID network and transformer configurations illustrated in FIGS. 1 and 2.

An electrical schematic diagram of the symmetrical SQUID assembly diagrammed in FIGS. 1 and 2 is illustrated in FIG. 3. The FIG. 3 schematic diagram also includes resistive and capacitive elements that form a part of the preferred embodiment thin film device, illustrated in more detail in FIGS. 4–6. Referring thereto, it will be appreciated that the Josephson junctions 42 and 44 are operatively connected in series through the secondary feedback and input coils represented by the washers 15, 20, 10 and 25. The "FIG. 8" series connection can be traced from input bias pad 50, through bias lead 29, connector link 30, secondary input coil/washer 20, connector link. 31, secondary feedback coil/washer 15, Josephson junction 42, groundplane conductor 40, Josephson junction 44, secondary feedback coil/ washer 25, connecting link 32, secondary input coil/washer 10, and back to the connector link 30. Bias pad 51 is connected by means of the lead line 41 to both of the Josephson junctions 42 and 44 through the groundplane conductor 40. The input primary coils 60 and 61 are also connected in series between the input signal pads 52 and 53. Similarly, the feedback or modulation input coils 63 and 62 are connected in series between the feedback or modulation pads 54 and 55. Accordingly, only a single pair of bonding pads or terminals are required to energize each of the signal input and feedback transformers, and only a single pair of bias terminals are required to bias the SQUID inductance loop. Such pad reduction provides a significant improvement in simplicity and reliability over prior art parallel connected symmetrical SQUID configurations such as that of Simmonds.

Microwave resonances of the input circuit are damped in a nearly noise-free manner by the insertion of a series $R_xC_x$ shunt across the input coils (as hereinafter discussed in more detail). The $R_xC_x$ shunt components for the input coil 60 are illustrated in FIG. 3 at 70 and 71 respectively, and the $R_xC_x$ shunt components associated with the input coil 61 are illustrated at 72 and 73 respectively. Josephson junction 42 is illustrated in FIG. 3 as having a shunt resistor 74 and a capacitance 75 associated therewith. Similarly, Josephson junction 44 has a shunt resistance 76 and a capacitance 77 associated therewith. The parasitic capacitance associated with the input washer 10 is indicated at 78, and the parasitic capacitance associated with the input washer 20 is indicated at 79.

Figure 4:
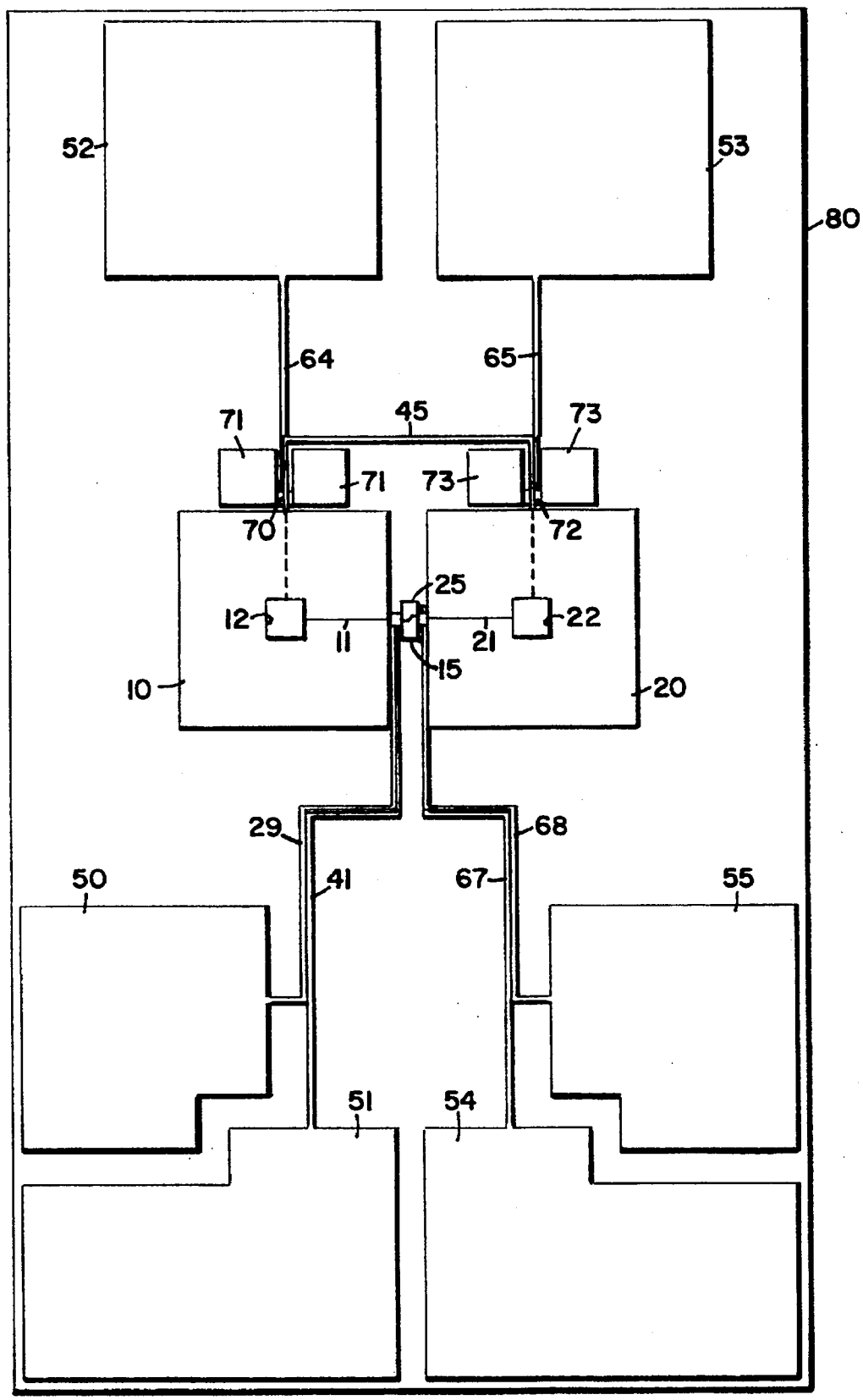
FIG. 4 is a diagrammatic layout diagram in plan view of a preferred embodiment of a thin film symmetric SQUID chip configured according to the principles of this invention.
Figure 5:
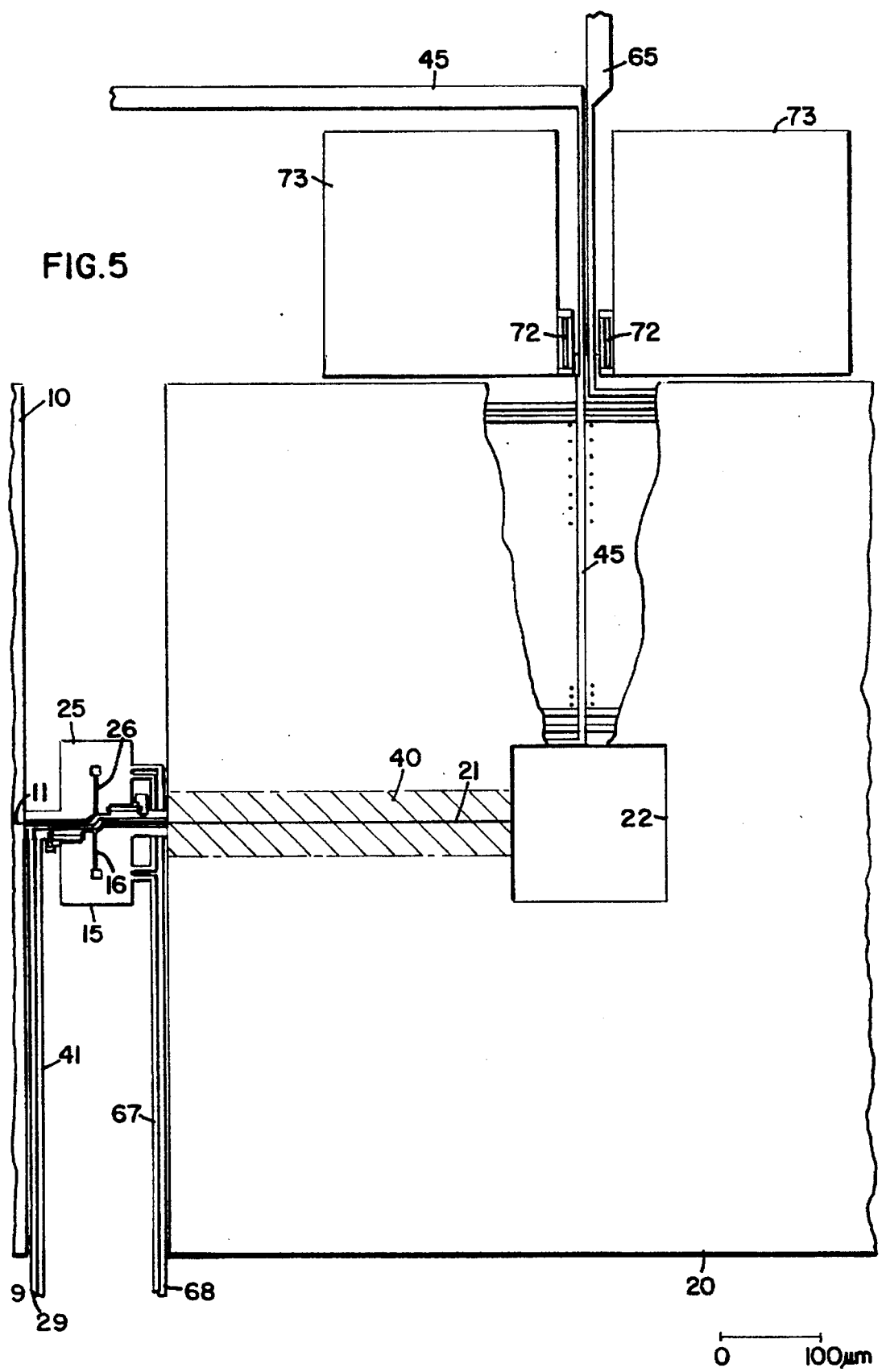
FIG. 5 is an enlarged fragmentary view of a portion of the thin film SQUID configuration of FIG. 4, illustrating one of the input washers in relation to the modulation or feedback washers.
Figure 6:
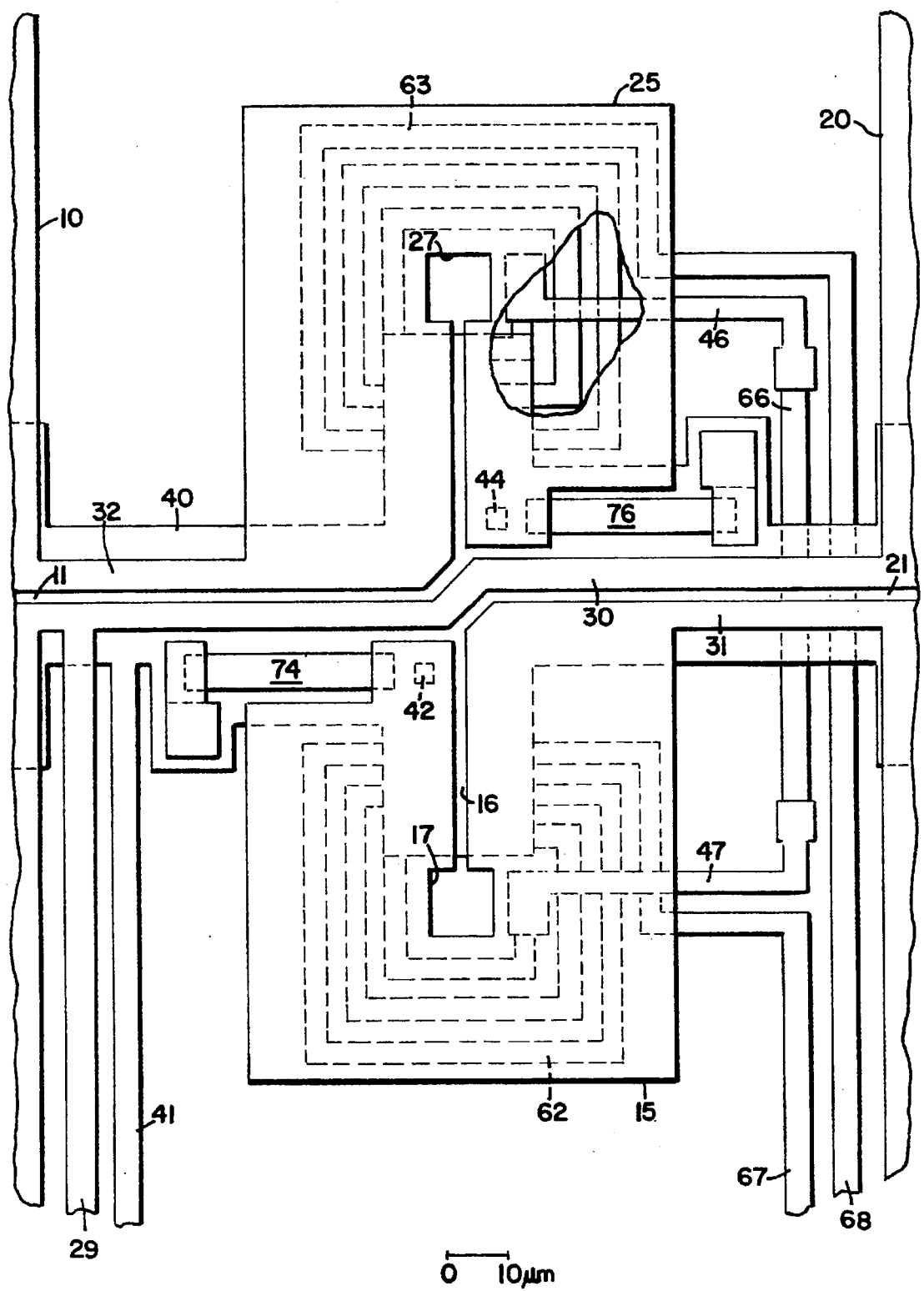
FIG. 6 is an enlarged fragmentary view of the modulation or feedback washer portions of the thin film chip configuration of FIGS. 4 and 5.

While the diagrammatic illustrations of FIGS. 1 and 2 enable the invention to be operatively described, they do not represent a scaled representation of the invention. A preferred embodiment of a thin film network or chip incorporating the symmetric design principles previously described with respect to FIGS. 1–3 is illustrated in more detail in FIGS. 4–6. FIGS. 4–6 are intended to illustrate the various film components of the assembly as they would proportionately appear relative to one another, but those skilled in the art will realize that the limitations inherent in patent drawings make the FIGS. 4–6 illustrations resolution, at best, approximations of the actual physical layouts.

A composite view of the entire thin film circuit or chip of the preferred embodiment as formed on a monolithic substrate is illustrated in FIG. 4. In the preferred embodiment, a plurality of the dc SQUID circuits are deposited on a 4 inch Si wafer having a thermally grown oxide layer. The symmetrical SQUID chip size of a single circuit, as illustrated at 80 in FIG. 4 is approximately 3 mm by 5 mm. In order to provide consistency with the diagrammatic layouts previously described with respect to FIGS. 1–3, the actual thin film implementation thereof, as illustrated in FIGS. 4–6, use the same numerical designations of the FIG. 1–3 diagrams. As illustrated in FIG. 4, when physically implemented in a functional circuit, the signal input washers 10 and 20 are significantly larger than the modulation or feedback washers 15 and 25. Due to drafting limitations, details of the modulation washer portions of the device have not been illustrated in any detail in FIG. 4. More detail thereof is shown in FIG. 6. In the physical implementation of the invention, it will be noted that the six bonding pads, suitable for standard nailhead bonding connection as well as pressure contacts using spring-loaded contact pins, occupy most of the space on the deposited dc SQUID chip. The FIGS. 4–6 implementation of the preferred embodiment also illustrates the two deposited $R_xC_x$ shunt resistors and capacitors of FIG. 3, namely 70,71 and 72,73 (see FIGS. 4 and 5) and the deposited Josephson junction shunt resistors 74 and 76 (best illustrated in FIG. 6).

An enlarged view of the signal input washer 10 portion of the symmetrical SQUID assembly of FIG. 4 is illustrated in FIG. 5. FIG. 5 better illustrates the relative size differential between the input signal washers 20 and 10 and the modulation or feedback washers 25 and 15. FIG. 5 also illustrates the close spacing and symmetrical orientation of the lead line pairs such as 29,41 and 67,68. Also illustrated, in fragmented view by partial removal of the overlying washer 20 material is a portion of the input coil winding 61 shown as connected to the lead lines 65 and 45. The degree of groundplane 40 overlap with the slot 21 of washer 20 is also apparent. A further enlarged view of the modulation coil and washer portions 15 and 25 of the symmetrical SQUID assembly of FIGS. 4 and 5 is shown in FIG. 6. FIG. 6 illustrates the symmetrical orientation of the components and their lead lines, the extent of the groundplane 40, the Josephson junctions 42 and 44. Modulation coils 62 and 63 are shown connected in series between lead lines 67 and 68 by means of the connecting links 46,66 and 47. It is noted that link 66 and the lead line 68 underlie the groundplane 40. FIG. 6 also best illustrates the deposited shunt resistors 74 and 76 for Josephson junction 42 and 44 respectively, and the overall symmetry of the film layout.

The preferred process sequence used to fabricate the thin film symmetrical SQUID chip of the preferred embodiment illustrated has been selected to be generally consistent with previous designs for ultralow-noise SQUIDs, and consistent with currently available process technology. A Nb film (150 nm thick) is sputter deposited onto a Si wafer having a thermally grown oxide layer. The first Nb film is patterned using a wet etchant to define the input coils 60, 61, 62 and 63 and contact pads 50–55 of the network. While only a portion of the input coil 61 is illustrated in FIG. 5, and the modulation coils 62 and 63 are illustrated as dashed lines in FIG. 6, it will be appreciated that the input and modulation coils underlie the washer conductors, as previously described with respect to FIGS. 1–3. The linewidths and pitch of the input (60, 61) and feedback (62, 63) coils are 3 µm and 6 µm respectively. The wet etchant provides nicely tapered edges which are essential to prevent shorts to subsequent layers, and minimizes sensitivity to electrostatic discharge. A 150 nm thick PECVD $SiO_2$ insulation layer is next deposited over the coil patterns. The insulation layer can be deposited at elevated temperatures to ensure that a low dielectric constant is obtained. Contact vias to the coils are etched through the $SiO_2$ using buffered HF. Next, a trilayer of Nb/Al—$AlO_x$/Nb is deposited and patterned using RIE. In depositing the trilayer, a 200 nm Nb layer is first deposited and immediately followed by a thin (50 nm) Al layer. The Al is then exposed to pure oxygen to form the tunnel barrier. The dependence of the junction critical current density ($J_c$) on the oxidation conditions is predetermined (as hereinafter described) so that the conditions necessary to obtain the design value of $J_c$=90A/cm$^2$ are known. After oxidizing the Al, a thin 30 nm layer of Nb is deposited to complete the trilayer. The trilayer forms not only the Josephson junctions, but also the groundplane 40 for the washer slits, the conductive path between the Josephson junctions in the series circuit, the current return path 45 for the input coil, the current return path links 46 and 47 for the primaries of the input modulation coils and the lower electrodes of the capacitors 71 and 73. The upper Nb layer of the trilayer is then anodized to isolate the Josephson junctions and define high critical current contacts to the lower Nb layer of the trilayer. The anodized $Nb_2O_5$ layer is approximately 100 nm thick and defines the capacitor dielectric layers. The anodization is most easily carried out using a resist mask. The Josephson junctions 42 and 44 for the SQUID configuration are nominally 3×3 µm$^2$. With corner-rounding, the actual junction area and capacitance are estimated to be A=5.5 µm$^2$ and C=0.45pF, respectively.

After the anodization step, a second 150 nm blanket layer PECVD $SiO_2$ is deposited at a reduced temperature, and contact vias are opened as before, to expose the junctions and contacts to the base electrode, capacitors, and pads. The reduced temperature is necessary to avoid deterioration of the Josephson junctions. However, it has been found that a high-quality oxide with a reasonable dielectric constant and minimal pinhole density can be deposited in this way. Next, a thin (25 nm) Pd resistor layer is sputter deposited and patterned using lift-off methods which can be done with negligible film tearing if the resist stencil is properly prepared. The Pd defines the shunt resistors of the FIG. 3 circuit in order to ensure that the SQUID will be operable for temperatures of T<<4.2K. The Pd also protects the pads from corroding in air. The final Nb layer (350 nm thick) is then deposited and patterned using RIE, to define the washers, the top electrodes of the capacitors, and interconnects, as previously described. To complete the wafer, a 200 nm $SiO_2$ passivation layer is deposited, and vias to the contact pads are opened.

Design Optimization

The symmetrical series-connected SQUID configuration of this invention is particularly applicable to the design of a dc SQUID with low equivalent input current noise. The following overview of some of the desired design features of such a SQUID will assist in understanding the detailed optimization criteria for the SQUID configuration. The optimization has been carried out for designs which minimize the SQUID responsivity to ambient magnetic fields. Since these ambient fields are usually due to distant sources they generally can be considered to be uniform over a length scale of the order of the outer dimension of the SQUID. For the low-noise SQUID, for example, a two-hole geometry, consisting of two washers connected either in series or in parallel, therefore offers a high degree of selectivity against ambient fields. The parasitic capacitance introduced in a series configuration, however, is likely to be significantly lower than that introduced in a parallel configuration. Perhaps more significantly, even though a perfectly balanced parallel configuration exhibits zero response to a uniform applied field, a substantial screening current in the SQUID loops can still be induced. Conceivably, this screening current may lead to flux trapping in the SQUID or junctions, resulting in significantly reduced performance. In the series configuration of this invention, the response to a uniform field is also zero, but the screening currents cancel as well. Further, performance projections confirm that there is little loss in sensitivity with the series configuration.

In order to operate a SQUID in a flux-locked mode, feedback must be applied to the SQUID. If the feedback circuit is not properly designed, however, the feedback circuit may significantly couple to the input circuit. It is possible to greatly reduce this effect by using separate secondaries to couple the input and feedback signals to the SQUID. The total inductance of the SQUID, L, is then the sum of two parts: $L=L_{s,i}+L_{s,f}$ where $L_{s,i}+L_{s,f}$ are the inductances of the input and feedback secondaries, respectively. In order to preserve the symmetry and minimize cross-coupling, two pairs of secondary loops are used, and the two pairs are arranged at right angles to each other. This is diagrammatically shown in FIGS. 1 and 2 and in FIGS. 4–6. In principle, the Josephson junctions may be connected in parallel or in series with the secondaries. The reduced parasitic capacitance of the series configuration is an advantage, however, and it has been found that it is difficult to prevent the washer resonance in a parallel configuration from moving too close and interfering with the intended operating frequency of the SQUID. This is shown in more detail below. Thus, for conventional operation, the series configuration is preferable.

The functional form that is minimized in a design optimization is an application specific parameter. Methods of SQUID design optimization are well-known in the art. Those not knowledgeable are referred to J. Knuutila, et al., "Design, Optimization, and Construction of a DC SQUID with Complete Flux Transformer Circuits," J. Low Temp. Phys. 71: 369–392 (1988). For magnetometer or gradiometer applications, for example, it is generally more desirable to minimize the magnetic field or field gradient noise, respectively, rather than the energy resolution. The minimized field noise does not necessarily coincide with either the minimum of the energy resolution or the magnetic flux noise. Fortunately, the minima of the energy resolution and noise functions are rather broad, making it possible to optimize one performance parameter without significantly degrading the others. Since a low current noise is generally required for many applications, the energy resolution is not necessarily the appropriate figure of merit for these devices. Rather, it is desirable to minimize the equivalent input current noise $S_I^{1/2}(f)$, which is given by $$S_I^{1/2}(f) = \frac{S_\Phi^{1/2}(f)}{M_i} = \frac{\sqrt{2L\epsilon_p}}{M_i}, \quad (1)$$

where L is the total SQUID inductance; $M_i$ is the mutual inductance of the input coil $L_i$ and the input secondary; and $\epsilon_p$ is the energy resolution which takes into account the parasitic capacitance, which may be written as $$\epsilon_p = \epsilon\sqrt{1+2C_p/C} = \gamma k_B T\sqrt{LC(1+2C_p/C)} \quad (C_p/C \leq 2) \quad (2)$$

$$\epsilon_p = \sqrt{5}\,\epsilon \quad (C_p/C > 2) \quad (3)$$

$\gamma$ where is a constant which depends on design dependent parameters only. From Eq. (1) it is clear that optimum performance requires a SQUID with low flux noise and an input circuit with high mutual inductance. It is noted that both of these quantities depend on the same parameters and therefore cannot be optimized separately. Eq. (1) is the functional form used to carry out the design optimization of the SQUID.

The input and feedback coils and their secondaries must be designed by taking into account possible microwave resonances. It has been shown previously that the resonant properties of two washers connected in series or in parallel are determined solely by the design of the individual washers. This means that there is little interaction between the washers as far as the stripline and washer resonances are concerned, so the input and feedback circuits can be designed separately. The inductance of the feedback secondary should be a small fraction of the total SQUID inductance, yet large enough so that the mutual inductance of the feedback coil and secondary, $M_f$, is sufficient to ensure that the feedback current $\Delta I_f/\Phi_o$ is roughly in the range 1–10 $\mu A\Phi_o$. This is necessary to further prevent feedback current from coupling through to the load and to provide sufficient feedback dynamic range.

Figure 7:
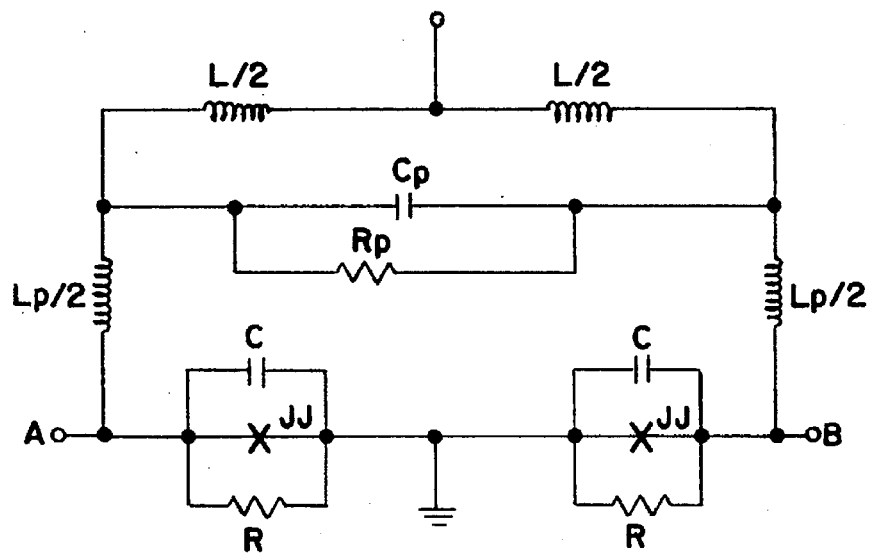
FIG. 7 is a schematic diagram of a double-loop dc SQUID.

Because of the separate input and feedback circuits, the symmetric SQUID shown in FIG. 3 is essentially a double-loop (FIG. 7) device. For the symmetric SQUID, the inductance of the feedback secondary may be viewed as a parasitic inductance, since it is small and not part of the input coupling circuit. Then, at high frequencies, the high parasitic capacitance of the input secondary is essentially a short, leading to a resonance at a frequency $f_r=(½)(L_{s,f}(C/2))^{-½}$. Inside this high frequency resonance, the SQUID characteristics are very smooth, and the energy resolution is nearly the same as that for a SQUID having the same total inductance but with Cp=0. This additional high-frequency mode of operation may in principle be realized with either the series or parallel configurations, although the effects of the potentially very high parasitic capacitance of the parallel configuration are unclear.

In order to more easily compare the FIG. 3 symmetrical circuit with the design criteria, the following equivalence chart can be applied to the FIG. 3 circuit:

TABLE 2

FIG. 3 Circuit Component Equivalents

| Number on FIG. 3 Terminology | Component | Design |
|---|---|---|
| 10, 20 | input/washer | $L_{s,i}/2$ |
| 15, 25 | feedback/washer | $L_{s,f}/2$ |
| 42, 44 | Josephson junction | JJ |

TABLE 2-continued

FIG. 3 Circuit Component Equivalents

| Number on FIG. 3 Terminology | Component | Design |
| --- | --- | --- |
| 60, 61 | input coil | $L_i/2$ |
| 62, 63 | feedback coil | $L_f/2$ |
| 70, 72 | RC shunt resistor | $2R_s$ |
| 71, 73 | RC shunt capacitor | $C_s/2$ |
| 74, 76 | junction shunt resistor | R |
| 75, 77 | junction capacitance | C |
| 78, 79 | parasitic capacitance | $2C_p$ |

We can now discuss the optimization of the symmetrical series-connected SQUID configuration of the preferred embodiment, in detail. In order to be useful for a broad range of experiments, a load inductance of 1 μm has been assumed. As discussed above, a gradiometric washer configuration is preferred in order to minimize sensitivity to external signals. Optimizations of the input circuit have been carried out for both the series and parallel configurations by minimizing the equivalent input current noise $S_I^{1/2}(f)$. Generally, an overlap of 25 μm per side was used.

FIG. 8 illustrates a number of comparative plots for the series-connected dc SQUID configuration of this invention versus that a parallel-connected configuration. The optimized input secondary inductances $L_{s,i}$ (filled symbols) and corresponding washer hole widths d (open symbols) are shown in FIG. 8a as functions of the number of turns N in the input coil. Similarly, the variation of the parasitic capacitance $C_p$ is shown in FIG. 8b as a ratio of the parasitic capacitance to the junction capacitance ($C_p/C$), as a function of the number of turns in the input coil. Because of the saturation effect of the energy resolution for large $C_p$, the input secondary inductances of the two configurations are not significantly different, even though the parasitic capacitance differs substantially. For the series configuration, however, the width of the washer hole is significantly smaller. The large size of the parallel configured washers will cause this design to be much more sensitive to the formation of large screening currents and possibly to increased flux trapping. For the series configuration, as long as the SQUID is well balanced, these screening currents cancel.

Figure 8A:
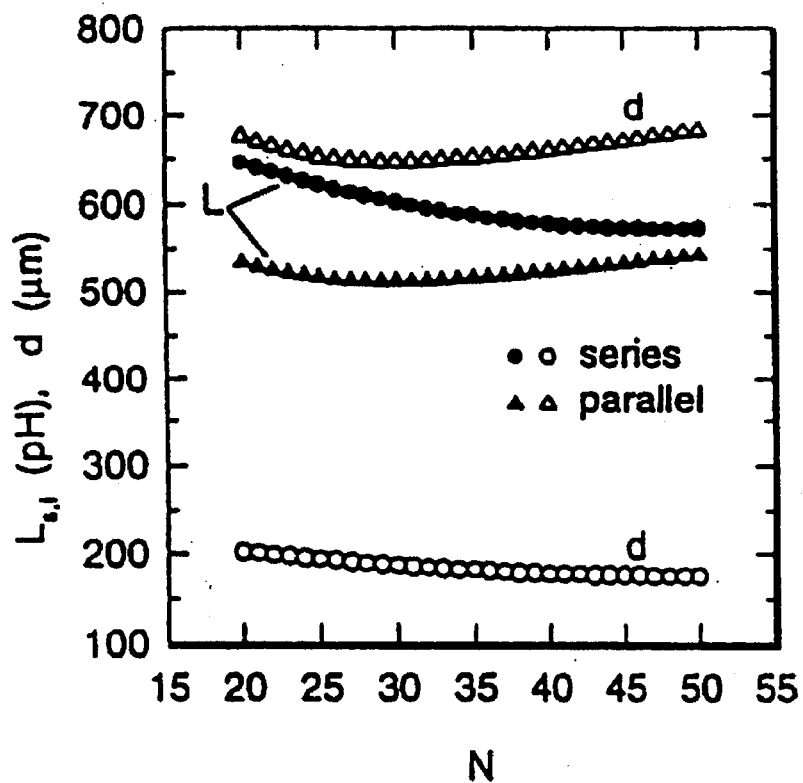
FIG. 8a shows the optimized input secondary inductances and corresponding washer hole widths as functions of the number of turns in the input coil.
Figure 8B:
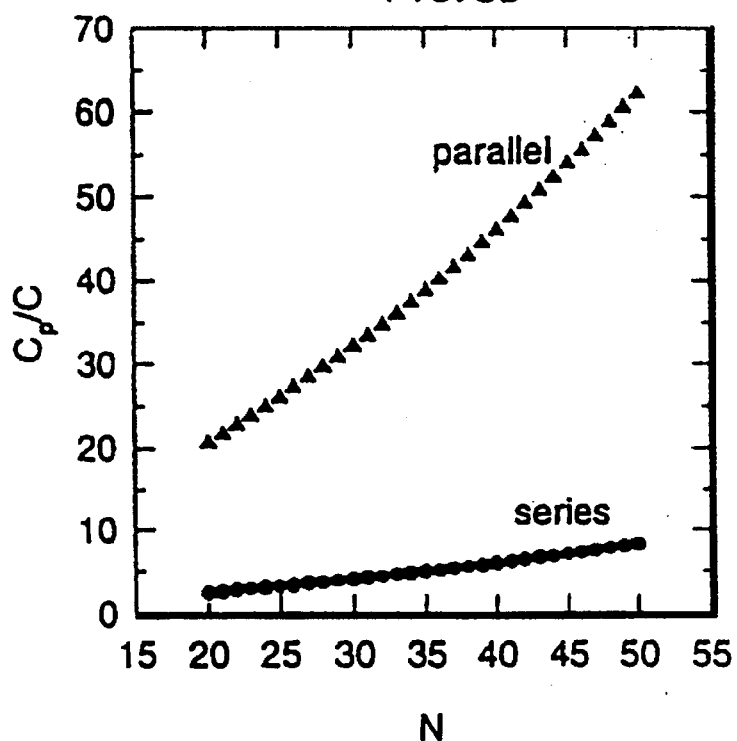
FIG. 8b shows the variation of the parasitic capacitance as a function of the number of turns in the input coil.
Figure 8C:
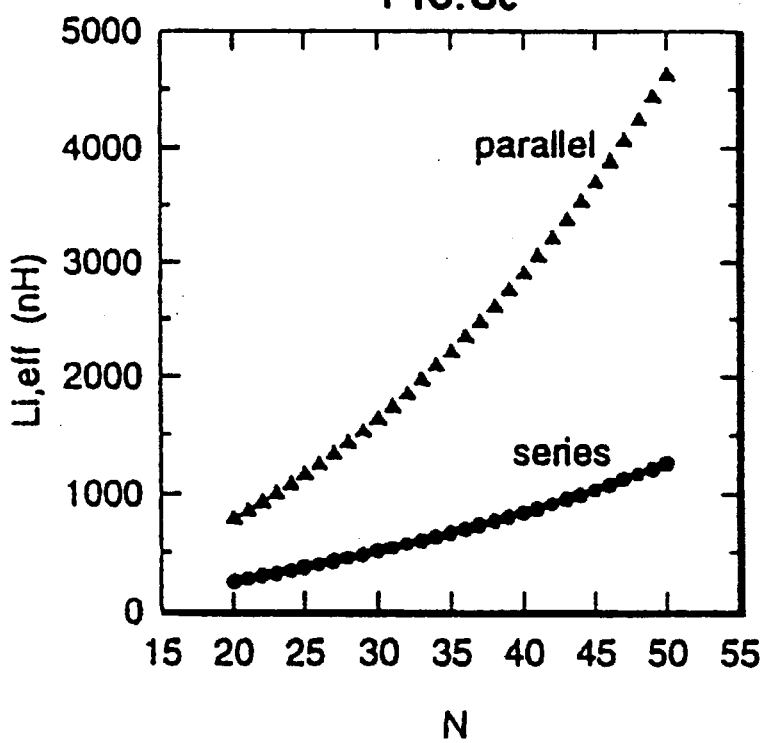
FIG. 8c plots the optimized effective input inductance as a function of the number of turns in the input coil.
Figure 8D:
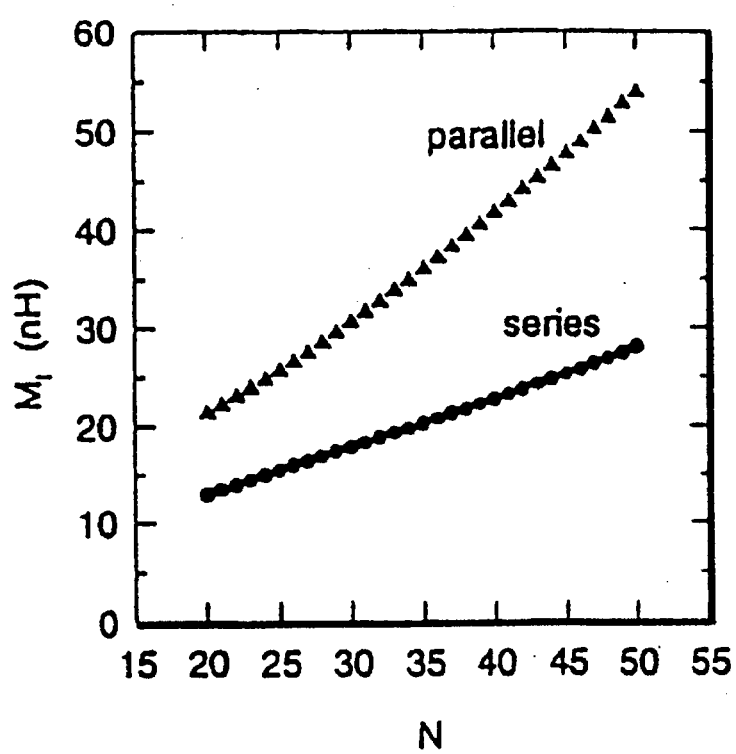
FIG. 8d plots the mutual inductance as a function of the number of turns of the input coil.
Figure 8E:
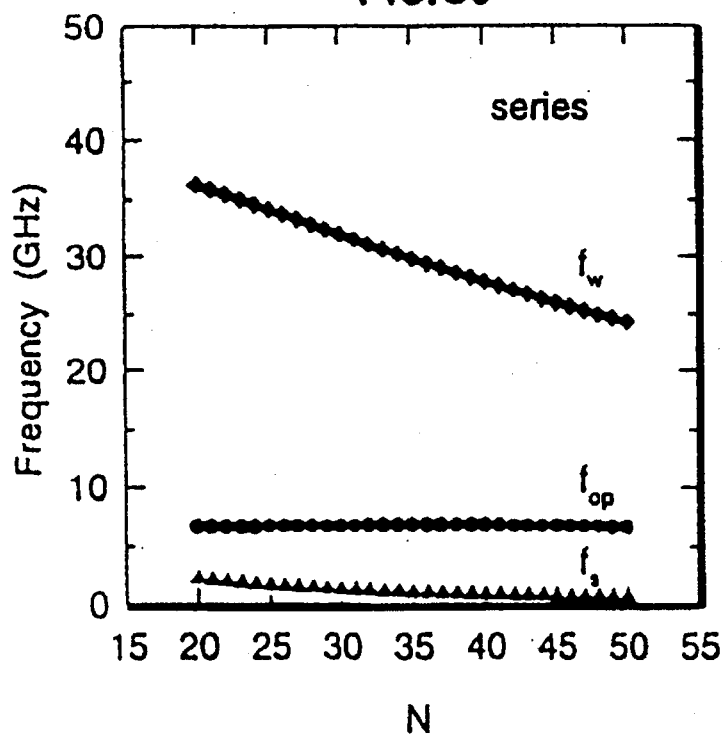
FIG. 8e plots the resonant frequencies of the input secondary washer, the input coil microstripline and the intended operating frequency as functions of the number of turns in the input coil for the series-connected configuration.
Figure 8F:
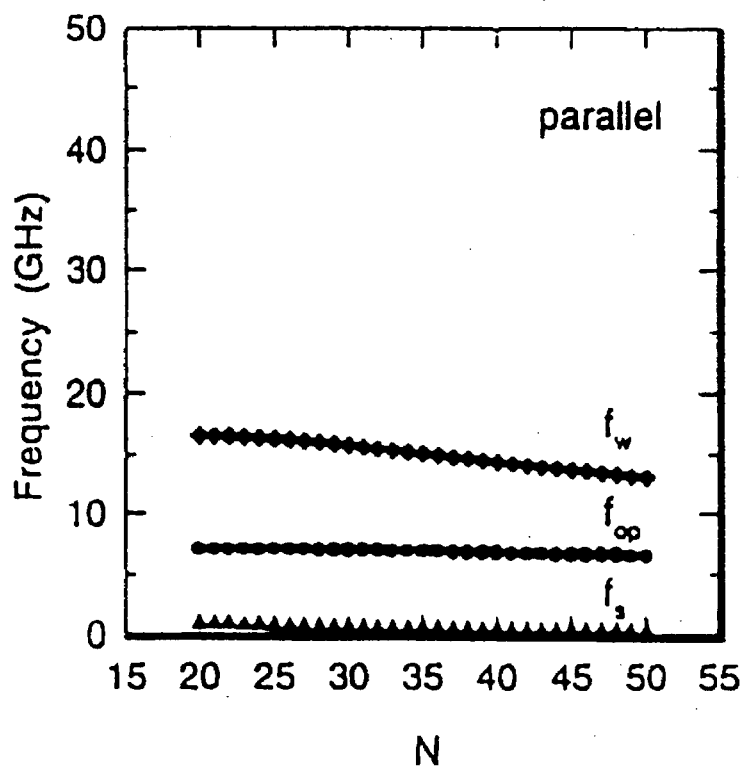
FIG. 8f plots the resonant frequencies of the input secondary washer, the input coil microstripline and the intended operating frequency as functions of the number of turns in the input coil for a parallel-connected configuration.

The optimized effective input inductance $L_{i,eff}$ (which takes into account the screening effect of the input secondary inductance) and the mutual inductance $M_i$ are shown over the same range of N in FIGS. 8c and 8d, respectively. Matching to a 1 μH load inductance requires input coil designs with 23 and 45 turns for the parallel and series configurations, respectively, with corresponding mutual inductances of 24 nH and 25 nH, respectively. Since the secondary inductances are not significantly different, the input coil of the parallel configuration requires far fewer turns. This may seem to be advantageous, but it is necessary to examine the behavior of the microwave resonances. The fundamental of the stripline resonance at frequency $f_s$ is calculated from the total length of the input coil. In the preferred embodiment the input and feedback coils have been designed to be floating, so the total length corresponds to λ/2 in both cases. The washer resonance at frequency $f_w/2$ is calculated using a previously developed equivalent circuit model of the coupled SQUID. According to simulations, the frequency $f_{op}$ corresponding to the optimal point of operation is given by $f_{op}=0.3f_J$, where the Josephson frequency $f_J=I_cR/\Phi_O$. These frequencies are plotted as functions of N in FIGS. 8e and 8f. The resonant frequencies of the input secondary washer are plotted as diamonds, those of the input coil microstripline as triangles, and those for the intended operating frequency as circles. Previous results suggest that it is necessary to maintain roughly a factor of 4 difference between the intended operating frequency and the stripline and washer resonant frequencies; that is, $4f_s < f_{op} < f_w/4$. Because of the large number of turns required to match the load inductance, $f_{op} \gg f_s$ for both configurations, but in the parallel configuration the washer resonance is dangerously close to the intended operating frequency of the SQUID. This is another drawback of the parallel design.

Figure 8G:
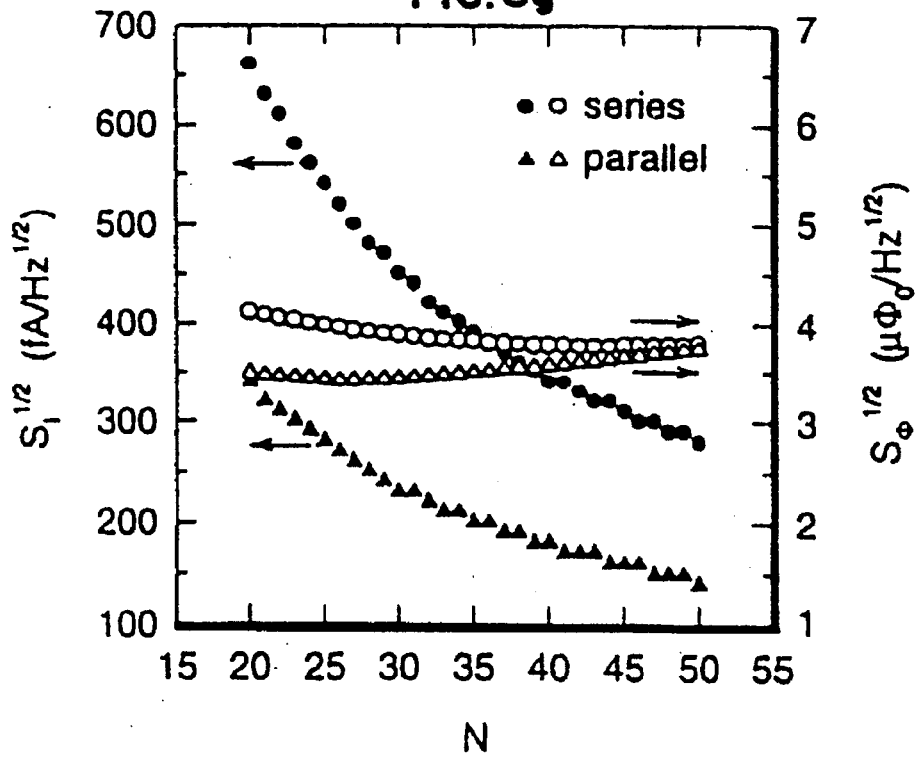
FIG. 8g plots the minimized equivalent current noise and the magnetic flux noise as functions of the number of turns of the input coil for both the series and parallel-connected configurations.
Figure 8H:
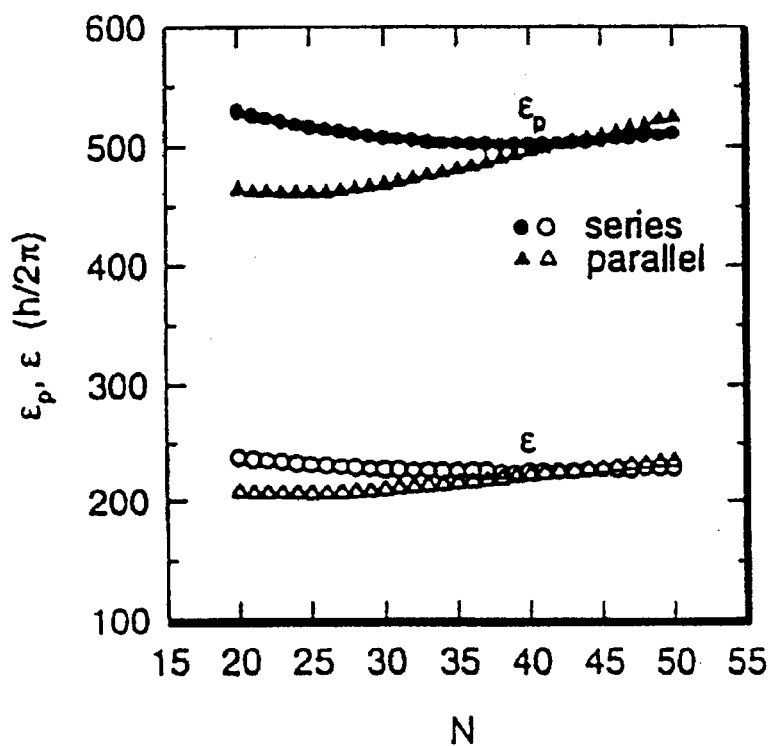
FIG. 8h plots the energy resolutions for both parasitic capacitance equal to zero and parasitic capacitance not equal to zero as functions of the number of turns of the input coil, for both the parallel and series configurations.

The minimized equivalent current noise $S_I^{1/2}(f)$ and magnetic flux noise $S_\Phi^{1/2}(f)$ are shown in FIG. 8g as functions of the number of turns N in the input coil. The minimized equivalent current noise is illustrated by filled symbols, and the magnetic flux noise is indicated by open symbols. The current noise improves steadily as N increases because of the increasing mutual inductance; for the values of N required to satisfy inductance matching to the load, however, the current noise of the parallel and series configurations are nearly the same, being 300fA/√Hz and 310fA/√Hz, respectively. The flux noise is also comparable, with broad minima of 3.4 $\mu\Phi_O$/√Hz and 3.8 $\mu\Phi_O$/√Hz around N=26 and N=43 for the parallel and series configurations, respectively. The energy resolutions $\epsilon_p$ and $\epsilon$ are shown in FIG. 8h as a function of the number of turns of the input coil. The energy resolution $\epsilon_p$ where $C_p \neq 0$, is indicated by filled symbols. The energy resolution $\epsilon$, where $C_p=0$, is indicated by open symbols. The energy resolutions $\epsilon_p$ calculated with the effect of parasitic capacitance taken into account exhibit broad minima of 461ℏ and 501ℏ around N=25 and N=38 for the parallel and series configurations, respectively. The minima are broad and close to but not coincident with the flux noise minima. In terms of noise performance, the parallel and series configurations are therefore seen to be comparable. The energy resolution $\epsilon$ determined from separate optimizations carried out neglecting the parasitic capacitance (i.e., for $C_p=0$) is roughly a factor of √5 lower, as expected. This suggests that a reasonable performance enhancement may be achieved for operation inside the high-frequency double-loop resonance. In particular, for the value of N required to satisfy inductance matching, the current noise is about 200fA√Hz for both configurations for operation inside the high-frequency resonance. To be successful, this requires that the feedback circuit be properly designed.

Figure 9:
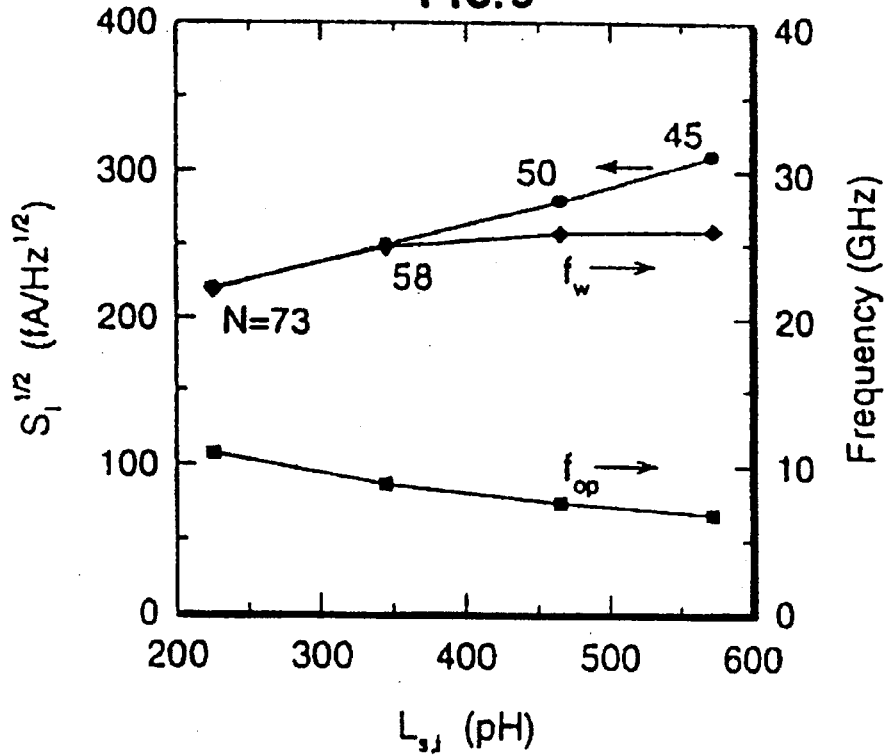
FIG. 9 is a plot of optimized current noise, the resonant frequency of the input secondary washer, and the intended operating frequency as functions of the input secondary inductance for the series-connected configuration.

Summarizing the above results, it can be appreciated that the series-connected configuration is preferable for a number of reasons. One possible concern is that the minimization of the equivalent current noise necessarily leads to a rather high input secondary inductance and hence total SQUID inductance. Low-noise, high inductance (~400 pH) SQUIDs have been made previously, but the inductance necessary for a low-noise SQUID implied by the results in FIGS. 8a and 8b is much higher. For this reason, it is of interest to carry out optimizations for fixed inductance of the input secondary. This has been done for the series configuration and the results are summarized in FIG. 9. FIG. 9 plots the optimized current noise (circles), the resonant frequency of the input secondary washer (diamonds), and the intended operating frequency (squares) as functions of the input secondary inductance. The optimizations have been carried out subject to the constraint of inductance matching to a 1 μH load. The number N of input coil turns required for each SQUID inductance is indicated. FIG. 9 shows that the current noise improves steadily as the inductance of the input secondary is reduced. The current noise values plotted are determined subject to the constraint of inductance matching to the 1 µH load. For this reason, the number of turns N in the input coil varies considerably, becoming very large as the secondary inductance is reduced. The respective values of N are shown in the figure. In order to accommodate an increasing number of turns in the input coil, the secondary washer must be made larger, thereby pushing the washer resonance to lower frequencies. At the same time, the intended operating frequency of the SQUID is pushed to higher frequencies as the SQUID inductance is reduced, owing to the increased critical current. These frequencies are seen to approach each other roughly for $L_{s,i}$<500 pH. Therefore a more conservative value $L_{s,i}$~500 pH is used for the input secondary. Choosing a hole width d=140 µm for the input secondary washers, for example, gives $L_{s,i}$=465 pH. Then, the inductance matching condition requires that N=50 turns be used for the input coil. It is shown below that the lower input secondary inductance used does not lead to any significant increase in the minimum current noise.

The microwave resonances of the input circuit are damped by the insertion of a series $R_xC_x$ shunt across the input coils, as previously discussed and shown in FIG. 3. The resistance $R_x$ is matched to the nominal impedance of the microstripline (16.3 Ω) and properly terminates the "open" end as the stripline leaves the washer. The capacitances $C_x$ fixes the resonant frequency of the input circuit. Choosing $C_x$=100 pF fixes the input circuit resonance at 42 MHz. The Q-value of the resonance, Q=2.7, ensures that the resonance is well damped, but not over-damped to prevent the Josephson oscillations from mixing noise down to low frequencies. Further damping may be provided by an optional damping resistor $R_p$ placed across each of the input secondary washers.

The feedback circuit must be designed so that the inductance of the feedback secondary $L_{s,f}$ is much smaller than the inductance of the input secondary $L_{s,i}$. In addition, the mutual inductance $M_f$ of the feedback coil $L_f$ and the feedback secondary must be sufficient to ensure that the feedback current $\Delta I_f/\Phi_O$ is roughly in the range 1–10 µA/$\Phi_O$. This is necessary in order to prevent excessive current from coupling through to the load. It is estimated that the feedback current is given by $$\Delta I_f \approx \frac{\Phi_O}{M_f} \frac{L_{s,f}}{L_{s,f}+L_{s,i}^{(dc)}}, \quad (4)$$

where $L_{s,i}^{(dc)}$ is the screened inductance of the input secondary. These requirements must be met subject to the usual conditions on the microwave resonances discussed previously. We start by choosing a hole width of d=10 µm for the feedback secondary washers, which gives $L_{s,f}$=37 pH. Then, for $L_{s,i}$=465 pH, the total SQUID inductance L=502 pH and $L/L_{s,f}$=13.6. Using N=3 turns for each of the feedback coils, $L_f$=360 pH and $M_f$=100 pH. According to Eq. (16), $\Delta I_f$≈3 µA, which is in the required range. Because of the small number of turns in the feedback coil, the stripline resonant frequency $f_s$=126 GHz and the washer resonant frequency $f_w$=142 GHz are both significantly higher than the range of SQUID operating frequencies. Similarly, the small parasitic capacitance (30fF) across the small feedback secondary inductance ensures that the feedback circuit resonance is also pushed to high frequencies. Thus, damping circuits for the feedback circuit are not necessary. For operation inside the high frequency resonance referred to earlier, $f_r$=(½)$(L_{s,f}(C/2))^{-½}$=55 GHz. This frequency is much higher than the microwave resonant frequencies of the input circuit, yet much lower than the resonant frequencies of the feedback circuit. Thus, this choice of design parameters for the feedback circuit should allow proper operation at a well-defined point in the conventional low frequency range or in the additional high frequency range arising from the double-loop SQUID geometry. Having determined the design parameters of the feedback circuit, the expected performance parameters of the SQUID are recalculated using the expression for the current noise in Eq. (1). Optimizing the critical current density for the fixed inductance L=502 pH and $\beta_c$=0.7, the critical current $I_c$=5 µA and the shunt resistance R=10Ω per junction are determined. The screened inductance parameter $\beta_{dc}$=2$L_{dc}I_c/\Phi_O$=1.2, where $L_{dc}$ is the screened SQUID inductance, so the maximum peak-to-peak current swing is roughly $\Delta I_m$≈5 µA. The equivalent current noise of the series configured input SQUID $S_I^{1/2}$(f)=310fA/√Hz, so that no degradation of the noise performance occurs because of the lower SQUID inductance chosen. This is a consequence of the wide breadth of the noise minimum. It is not advisable to further reduce the SQUID inductance (to reduce the flux noise, for example) because then the inductance matching condition requires that more turns be added to the input coils, causing the input secondary washer resonance to move too close to the intended operating frequency. The calculated flux noise $S_\Phi^{1/2}$(f)=3.3µ$\Phi_O$/√Hz and the energy resolution $\epsilon_p$=450ℏ. The flux noise at 1 Hz, and hence the low frequency current noise as well, are expected to be comparable to the white noise values given. The full set of design and performance parameters of the dc series-connected input SQUID configuration of the preferred embodiment as designed for use as a low-noise input stage of an amplifier are summarized in Table 3 below.

TABLE 3

Series-Connected dc SQUID Design and
Calculated Performance Parameters for T = 4.2K

| | VALUE |
|---|---|
| INPUT CIRCUIT PARAMETER | |
| Input secondary $L_{s,i}$ | 465 pH |
| Input coil turns N | 50 |
| Eff. input ind. $L_{i,eff}$ | 1 µH |
| Mutual inductance $M_i$ | 23 nH |
| Coupling constant $k_i$ | 0.99 |
| Parasitic capacitance $C_p$ | 3.5 pF |
| Stripline resonance $f_s$ | 0.6 GHz |
| Washer resonance $f_w$ | 28 GHz |
| Shunt resistance $R_x$ | 16.3 Ω |
| Shunt capacitance $C_x$ | 100 pF |
| FEEDBACK CIRCUIT PARAMETER | |
| Feedback secondary $L_{s,f}$ | 37 pH |
| Feedback coil turns N | 3 |
| Feedback loop ind. $L_f$ | 360 pH |
| Mutual inductance $M_f$ | 100 pH |
| Coupling constant $k_f$ | 0.88 |
| Parasitic capacitance $C_p$ | 0.03 pF |
| Stripline resonance $f_s$ | 63 GHz |
| Washer resonance $f_w$ | 128 GHz |
| SQUID PARAMETER | |
| Inductance | 502 pH |
| Screened inductance $L_{dc}$ | 262 pH |
| Critical current $I_c$ | 5 µA |
| Junction resistance R | 10 Ω |
| Junction capacitance C | 0.45 pF |
| Junction Area A | 5.5 µm² |
| $\beta = 2 L I_c/\Phi_0$ | 2.4 |
| $\beta_{dc} = 2 L_{dc}I_c/\Phi_0$ | 1.2 |
| $\beta_c = 2 \pi I_c R^2 C/\Phi_0$ | 0.7 |
| $f_{op} = 0.3 I_c R/\Phi_0$ | 7 GHz |
| Current noise $S_I^{1/2}$ (f) | 310 fA/√Hz |
| Flux noise $S_\Phi^{1/2}$ (f) | 3.3 µ$\Phi_0$/√Hz |
| Energy resolution $\epsilon_p$ | 450 ℏ |

From the foregoing, it will be appreciated that the series-connected symmetrical dc SQUID configuration described offers significant advantages over the prior parallel configurations. While the present invention has been described with respect to its application as a SQUID with low equivalent input current noise, and with regard to a preferred low-temperature thin film superconductor implementation, it will be understood that the invention is not intended to be limited to the specifics of the described preferred embodiments. A variety of applications for the SQUID are possible, including use in amplifiers, magnetometers, gradiometers and susceptometers. The invention may also be adapted for high-temperature thin film superconductors. Such descriptions are intended to provide specific examples of embodiments which clearly describe and disclose the present invention. Accordingly, the invention is not limited to such described embodiments, or to the use of specific components, configurations or materials described therein, other than as defined by the claims herein. All alternative modifications and variations of the invention which fall within the broad scope of the appended claims are covered.

What is claimed is:

1. A symmetrical SQUID apparatus, comprising:
    (a) a substrate;
    (b) a first pair of identical superconductor washers symmetrically formed on said substrate to address each other in mirror-like configuration, each of said first pair of washers having a central opening and a slit extending therefrom to a washer edge at a central region of said apparatus; wherein said slits of said first pair of washers are commonly aligned;
    (c) a second pair of identical superconductor washers symmetrically formed on said substrate to address each other in mirror-like manner, each of said second pair of washers having a central opening and a slit extending therefrom to a washer edge at said central region; wherein said slits of said second pair of washers are commonly aligned and generally at right angles to the slits of said first pair of washers;
    (d) a pair of Josephson junctions symmetrically disposed in said central region on said substrate relative to said first and said second pair of washers;
    (e) superconductor connecting means on said substrate operatively connecting said first and said second pairs of washers in series through said Josephson junctions, forming a series-connected SQUID loop;
    (f) bias lead means operatively connected with said Josephson junctions for biasing said junctions;
    (g) first input lead means operatively connected with said first pair of washers for providing input signals thereto; and
    (h) second input lead means operatively connected with said second pair of washers for providing modulation input signals thereto.

2. The symmetrical SQUID apparatus of claim 1, further including a superconductor ground plane substantially operatively overlying said slits of said first and said second pairs of washers.

3. The symmetrical SQUID apparatus of claim 1, wherein said first input lead means comprises:
    (a) a first pair of coil configurations respectively configured to overlie said first pair of washers in inductive coupling manner;
    (b) conductor means for operatively connecting said first pair of coil configurations in series; and
    (c) first and second input signal terminals operatively connected to opposite ends of the series-connected coils of said first pair of coil configurations.

4. The symmetrical SQUID apparatus of claim 3, wherein said first pair of coil configurations are electrically balanced and symmetrically disposed relative to one another and relative to said first pair of washers.

5. The symmetrical SQUID apparatus of claim 1, wherein said second input lead means comprises:
    (a) a second pair of coil configurations respectively configured to overlie said second pair of washers in inductive coupling manner;
    (b) connector means operatively connecting said second pair of coil configurations in series; and
    (c) third and fourth input signal terminals operatively connected to opposite ends of the series-connected coils of said second pair of coil configurations, to provide modulation or feedback input signals to said second pair of coil configurations.

6. The symmetrical SQUID apparatus of claim 5, wherein said second pair of coil configurations are electrically balanced and symmetrically disposed relative to one another and relative to said second pair of washers.

7. The symmetrical SQUID apparatus of claim 3, wherein said second input lead comprises:
    (a) a second pair of coil configurations respectively configured to overlie said second pair of washers in inductive coupling manner;
    (b) connector means operatively connecting said second pair of coil configurations in series; and
    (c) third and fourth input signal terminals operatively connected to opposite ends of the series-connected coils of said second pair of coil configurations (to provide modulation or feedback input signals to said second pair of coil configurations).

8. The symmetrical SQUID apparatus of claim 5, wherein said bias lead means and the lead connections to said third and fourth input signal terminals are symmetrically configured and routed on said substrate to prevent magnetic fields generated from electrical currents passing respectively therethrough from coupling to the SQUID loop.

9. The symmetrical SQUID apparatus of claim 1, wherein said SQUID apparatus further comprises a pair of shunt resisters on said substrate, one each of said resistors being operatively connected across each of said Josephson junctions.

10. The symmetrical SQUID apparatus of claim 3, wherein said SQUID apparatus further comprises a pair of series resistor capacitor shunt components on said substrate, one each of said resister capacitor shunt components being operatively connected in parallel with each of said first pair of coil configurations.

11. The symmetrical SQUID apparatus of claim 1, wherein said symmetrical SQUID apparatus comprises a layered thin film structure.

12. The symmetrical SQUID apparatus of claim 11, wherein the material comprising the superconductor portions of said SQUID apparatus is Niobium.

13. The symmetrical SQUID apparatus of claim 1, wherein the components forming said SQUID apparatus are symmetrically configured on said substrate and electrically balanced so as to operatively reduce noise in the apparatus.

14. The symmetrical SQUID apparatus of claim 1, wherein said superconductor connecting means connects said first and said second pairs of washers and said Josephson junctions in series by means of a FIG. 8 configuration having an electrical cross-over in said central region.

15. A symmetrical SQUID system, comprising:
    (a) first and second connected superconductor washers, forming a first SQUID washer pair;

(b) third and fourth connected superconductor washers, forming a second SQUID washer pair; said second SQUID washer pair being identically shaped and being symmetrically and oppositely oriented relative to said first SQUID washer pair about a central region;

(c) a pair of series-connected Josephson junctions in said central region, operatively symmetrically aligned relative to said first and said second SQUID washer pairs;

(d) superconductor connecting means for operatively connecting said first and second SQUID washer pairs in series through said pair of Josephson junctions to form a series-connected SQUID loop;

(e) first input circuit lead means symmetrically positioned relative to said first and second SQUID washer pairs for providing input signals thereto; and (f) output bias lead means operatively connected to said pair of Josephson junctions for biasing said junctions and for providing output signals from the SQUID system.

16. The symmetrical SQUID system of claim 15, wherein said first input circuit means comprises a pair of superconducting series-connected stripline input coils disposed in coupling relationship respectively with said first and third washers.

17. The symmetrical SQUID system of claim 16, further including modulation circuit means symmetrically positioned relative to said first and second SQUID washer pairs for providing feedback or modulation input signals thereto.

18. The symmetrical SQUID system of claim 17, wherein said first input circuit means comprises a pair of superconducting series-connected stripline modulation coils disposed in coupling relationship respectively with said second and fourth washers.

19. A method of configuring a SQUID circuit of the type having a pair of Josephson junctions, and input and modulation circuitry, for low-noise operation, comprising the steps of:

(a) providing input circuit portions of the SQUID circuit with high inductance for matching arbitrary external circuits;

(b) providing the SQUID circuit with a gradiometric configuration for desensitizing the SQUID circuit to uniform external ambient fields;

(c) symmetrically configuring modulation and input coil portions of the SQUID circuit to minimize signal coupling therebetween;

(d) routing signal flow paths for current bias and modulation signals of the SQUID circuit to prevent magnetic fields produced by signals flowing therethrough from coupling to the SQUID; and (e) electrically connecting the input and modulation secondary circuits of the SQUID in series with the Josephson junctions to minimize the rms current noise of the SQUID.

20. The method of claim 19, further including selecting parameters for the input and modulation circuit portions of the SQUID circuit to define a well-defined resonance point for the SQUID within which low-noise operation is possible.

21. The method of claim 20, wherein said resonance point is determined by $2L_m-(C/2)$ where $L_m$ is the inductance defined by an opening in one of two modulation washer portions of the SQUID circuit and C is the Josephson junction capacitance.

22. The method of claim 19, wherein the inductance of the input circuit portions of the SQUID circuit are greater or equal to about 1 μH.

23. A method of configuring a SQUID circuit of the type having a pair of Josephson junctions, and input and modulation circuitry, for low-noise operation, comprising the steps of:

(a) providing input circuit portions of the SQUID circuit with high inductance for matching arbitrary external circuits;

(b) providing the SQUID circuit with a gradiometric configuration for desensitizing the SQUID circuit to uniform external ambient fields;

(c) symmetrically configuring modulation and input coil portions of the SQUID circuit to minimize signal coupling therebetween;

(d) routing signal flow paths for current bias and modulation signals of the SQUID circuit to prevent magnetic fields produced by signals flowing therethrough from coupling to the SQUID; and (e) selecting parameters for the input and modulation circuit portions of the SQUID circuit to define a well-defined resonance point for the SQUID within which low-noise operation is possible.

24. The method of claim 23, wherein said resonance point is determined by the equation $(1/2\pi) [L_m(C/2)]$ $L_m$ is the sum of the inductances defined by the openings in the modulation washer portions and C is the Josephson junction capacitance.

* * * * *

UNITED STATES PATENT AND TRADEMARK OFFICE
CERTIFICATE OF CORRECTION

PATENT NO. : 5,656,937

DATED : AUGUST 12, 1997

INVENTOR(S) : CANTOR

It is certified that error appears in the above-identified patent and that said Letters Patent is hereby corrected as shown below:

Col. 16, line 45: "$f_r=(½)(L_{s,f}(C/2))^{-½}$" should read --$f_r=(1/2\pi)(L_{s,f}(C/2))^{-½}$--

Col. 16, line 49: "$C_p=O.$" should read --$C_p=O.$--

Col. 17, line 18: "$1\mu m$" should read --$1\mu H$--

Col. 19, line 62: "$f_r=(½)$" should read --$f_r=(1/2\pi)$--

Col. 20, line 62, table 3: "$310\ fA/\sqrt{\sqrt{Hz}}$" should read --$310\ fA/\sqrt{Hz}$--

Col. 20, line 63, table 3: "$3.3\ \mu\Phi_o/\sqrt{\sqrt{Hz}}$" should read --$3.3\ \mu\Phi_o/\sqrt{Hz}$--

Signed and Sealed this

Ninth Day of June, 1998

*Attest:*

BRUCE LEHMAN

*Attesting Officer*  *Commissioner of Patents and Trademarks*